United States Patent
Moroi et al.

(10) Patent No.: US 9,002,674 B2
(45) Date of Patent: *Apr. 7, 2015

(54) TEMPERATURE MEASUREMENT APPARATUS, METHOD OF MEASURING TEMPERATURE PROFILE, RECORDING MEDIUM AND HEAT TREATMENT APPARATUS

(75) Inventors: Masayuki Moroi, Yamanashi (JP); Hitoshi Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 443 days.

This patent is subject to a terminal disclaimer.

(21) Appl. No.: 13/478,325

(22) Filed: May 23, 2012

(65) Prior Publication Data
US 2012/0303313 A1 Nov. 29, 2012

(30) Foreign Application Priority Data
May 26, 2011 (JP) .................................. 2011-118386

(51) Int. Cl.
| | | |
|---|---|---|
| *C23C 16/455* | (2006.01) | |
| *C23C 16/458* | (2006.01) | |
| *C23C 16/46* | (2006.01) | |
| *C23C 16/52* | (2006.01) | |
| *G01J 5/02* | (2006.01) | |
| *G01J 5/08* | (2006.01) | |
| *G01J 5/00* | (2006.01) | |

(52) U.S. Cl.
CPC ....... *C23C 16/45525* (2013.01); *C23C 16/4584* (2013.01); *C23C 16/4585* (2013.01);
CPC .................. *C23C16/46* (2013.01); *C23C 16/52* (2013.01); *G01J 2005/0085* (2013.01); *G01J 5/0255* (2013.01); *G01J 5/0007* (2013.01); *G01J 5/025* (2013.01); *G01J 5/026* (2013.01); *G01J 5/089* (2013.01); *G01J 5/0893* (2013.01); *G01J 5/0809* (2013.01); *G01J 5/0022* (2013.01); *G01J 5/0831* (2013.01)

(58) Field of Classification Search
CPC ......... G01J 5/00; G01J 5/0003; G01J 5/0007; G01J 5/0022; G01J 5/0255; G01J 5/025; G01J 5/08; G01J 5/0846; G01J 5/0893; G01J 5/54; G01J 2005/0085; G01K 11/00; G01K 11/125; H01L 21/00; H01L 21/02; H01L 21/67; H01L 21/67115; H01L 21/67248; H01L 21/68714; H01L 21/68764; H01L 21/67771; H01L 21/263; H01L 21/268; H01L 21/324; H01L 22/10
USPC ......... 702/134, 35, 40, 81, 84, 127, 130, 135, 702/142, 145, 150–151, 156–157, 159, 702/189; 374/5–6, 10–11, 22, 100, 374/120–121, 124, 126, 131, 137, 163, 374/166–167; 432/33, 45, 49, 120–122, 432/124, 253; 250/338.1, 338.4, 339.04, 250/339.06, 339.11, 340, 341.1–341.2, 250/341.4, 341.6, 341.8, 492.1–492.2
See application file for complete search history.

(56) References Cited

U.S. PATENT DOCUMENTS

| | | | |
|---|---|---|---|
| 2009/0274454 A1* | 11/2009 | Aderhold et al. ............. | 392/416 |
| 2010/0124249 A1* | 5/2010 | Aderhold et al. ............. | 374/124 |
| 2013/0130187 A1* | 5/2013 | Moroi et al. ................... | 432/32 |

FOREIGN PATENT DOCUMENTS

JP  11-106289  4/1999

*Primary Examiner* — Toan Le
(74) *Attorney, Agent, or Firm* — IPUSA, PLLC

(57) ABSTRACT

A temperature measurement apparatus for measuring a temperature profile of a substrate mounted on a rotating table, including a radiation temperature measurement unit configured to measure the temperature of plural temperature measurement areas on a surface of the rotating table in a radius direction of the rotating table by scanning the surface of the rotating table in the radius direction; a temperature map generating unit that specifies the address of the temperature measurement area based on the number of the temperature measurement areas measured by the radiation temperature measurement unit for each of the scanning operations in the radius direction of the rotating table, and the rotating speed of the rotating table, and stores the temperature in correspondence with the corresponding address in a storing unit; and a temperature data display processing unit that displays a temperature profile of the rotating table.

14 Claims, 15 Drawing Sheets

TEMPERATURE MEASUREMENT APPARATUS, METHOD OF MEASURING TEMPERATURE PROFILE, RECORDING MEDIUM AND HEAT TREATMENT APPARATUS

BACKGROUND OF THE INVENTION

1. Field of the Invention

The present invention relates to a temperature measurement apparatus used for a heat treatment apparatus that performs a heat treatment to a substrate mounted on a rotating table while rotating the substrate by rotating the rotating table, a method of measuring a temperature profile, a recording medium and a heat treatment apparatus.

2. Description of the Related Art

For a heat treatment apparatus, an apparatus including a process container in which a rotating table is provided, is known. In this heat treatment apparatus, plural semiconductor wafers (which are examples of substrates, and hereinafter simply referred to as wafers) are mounted on the rotating table along a rotating direction. Further in this heat treatment apparatus, a gas supply unit that supplies process gas is provided to extend in a radius direction of the rotating table. Further, within this heat treatment apparatus, a heater for heating the wafers is provided and layers are deposited on the wafers by discharging the gas from the gas supply unit while the wafers are heated and the rotating table is rotated.

In such a heat treatment apparatus, a test to detect whether the wafers are heated to appropriate temperature is performed. This test is performed by using a wafer for measurement provided with a thermocouple, where the thermocouple is connected to an external detection device outside of the process container through a wiring. For the test, for example, after an operator places the wafers for measurement at areas of the rotating table for which wafers are to be mounted, the temperature of the heater is raised. Then, the temperature of the wafers for measurements is measured by the thermocouples. As the wiring is connected to each of the wafers for measurement as described above, the rotating table is kept immobilized during this test.

However, when forming films or layers, a temperature profile is generated by a placement of the heater at an area where the rotating table is rotated, and the wafers pass through such an area where the temperature profile is generated. Further, the wafers may be influenced by temperature of the discharged gas. Although the above described test is performed, the temperature of the wafers when forming the films cannot be accurately measured in such situations. Further, for a safety of the operator, in the above test, the temperature of the heater is raised after the wafers for measurement are placed on the rotating table. However, for an actual operation, a group of wafers may be introduced into the process container at timing when the process container is still heated after a previous group of wafers to which a process is performed is taken out from the process container. Therefore, a process of raising the temperature of the wafers in an actual process cannot be detected by the above described test.

Further, in order to detect the temperature profile on whole surfaces of the wafers, it is necessary to prepare an increased number of thermocouples to increase accuracy precision. However, there is a limitation in the number of thermocouples provided to each of the wafers for measurement because the space is limited. Therefore, there is a problem that the temperature profile cannot be accurately detected on the whole surfaces of the wafers.

Patent Document 1 discloses a method of measuring a temperature profile of a surface of a substrate which is mounted on a rotary susceptor provided in a reactor for vapor deposition of a thin layer. In this method, the temperature profile of the surface of the substrate is measured by continuously measuring temperature of the surface of the substrate mounted on the rotary susceptor by a temperature measurement unit provided at a predetermined position, analyzing a path of measured points of the substrate, which vary in accordance with a rotation of the susceptor, based on information of a rotating speed of the susceptor, and coordinating the temperature measured by the temperature measurement unit with the measured points of the substrate based on the analyzed path.

However, by the method disclosed in Patent Document 1, as the measured positions are determined based on the rotation of the substrate, it is difficult to regularly measure plural areas of the surface of the substrate.

PATENT DOCUMENT

[Patent Document 1] Japanese Laid-open Patent Publication No. H11-106289

SUMMARY OF THE INVENTION

The present invention is made in light of the above problems, and provides a technique to measure a temperature profile on a surface of a substrate which is mounted on a rotating table being rotated in a process container of a heat treatment apparatus.

According to an embodiment, there is provided a temperature measurement apparatus used for a heat treatment apparatus including a process container, in which a rotating table for mounting a substrate is provided, and a heater for heating the process container, including a radiation temperature measurement unit configured to measure the temperature of plural temperature measurement areas on a surface of the rotating table in a radius direction of the rotating table by scanning the surface of the rotating table in the radius direction; a temperature map generating unit that specifies the address of the temperature measurement area for which the radiation temperature measurement unit measures the temperature based on the number of the temperature measurement areas measured by the radiation temperature measurement unit for each of the scanning operations in the radius direction of the rotating table, and the rotating speed of the rotating table, and stores the temperature in correspondence with the corresponding address in a storing unit; and a temperature data display processing unit that displays a temperature profile of the rotating table based on the temperature and the address stored in the storing unit by the temperature map generating unit.

According to another embodiment, there is provided a heat treatment apparatus, including the process container in which the rotating table for mounting the substrate is provided; the heater that heats the process container; and the above temperature measurement apparatus.

According to another embodiment, there is provided a method of measuring a temperature profile of a substrate mounted on a rotating table within a process container included in a heat treatment apparatus which further includes a heater for heating the process container, including repeating a scanning operation, in which a radiation temperature measurement unit, which is configured to measure temperature of plural temperature measurement areas on a surface of the rotating table in a radius direction of the rotating table by scanning the surface of the rotating table in the radius direction, scans the surface of the rotating table, on which the substrate is mounted, in the radius direction to obtain the temperature of the plural temperature measurement areas in the radius direction while the rotating table is rotated in a circumferential direction of the rotating table with respect to the radiation temperature measurement unit; specifying the address of the temperature measurement area for which the temperature is obtained based on the number of the temperature measurement areas obtained by the radiation temperature measurement unit for each of the scanning operations in the radius direction of the rotating table, and the rotating speed of the rotating table; storing the temperature in correspondence with the corresponding address in a storing unit; and displaying the temperature profile of the surface of the substrate and the rotating table based on the temperature and the address stored in the storing unit.

According to another embodiment, there is provided a non-transitory computer-readable recording medium having recorded thereon a program that causes a computer to execute the above method of measuring a temperature profile.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
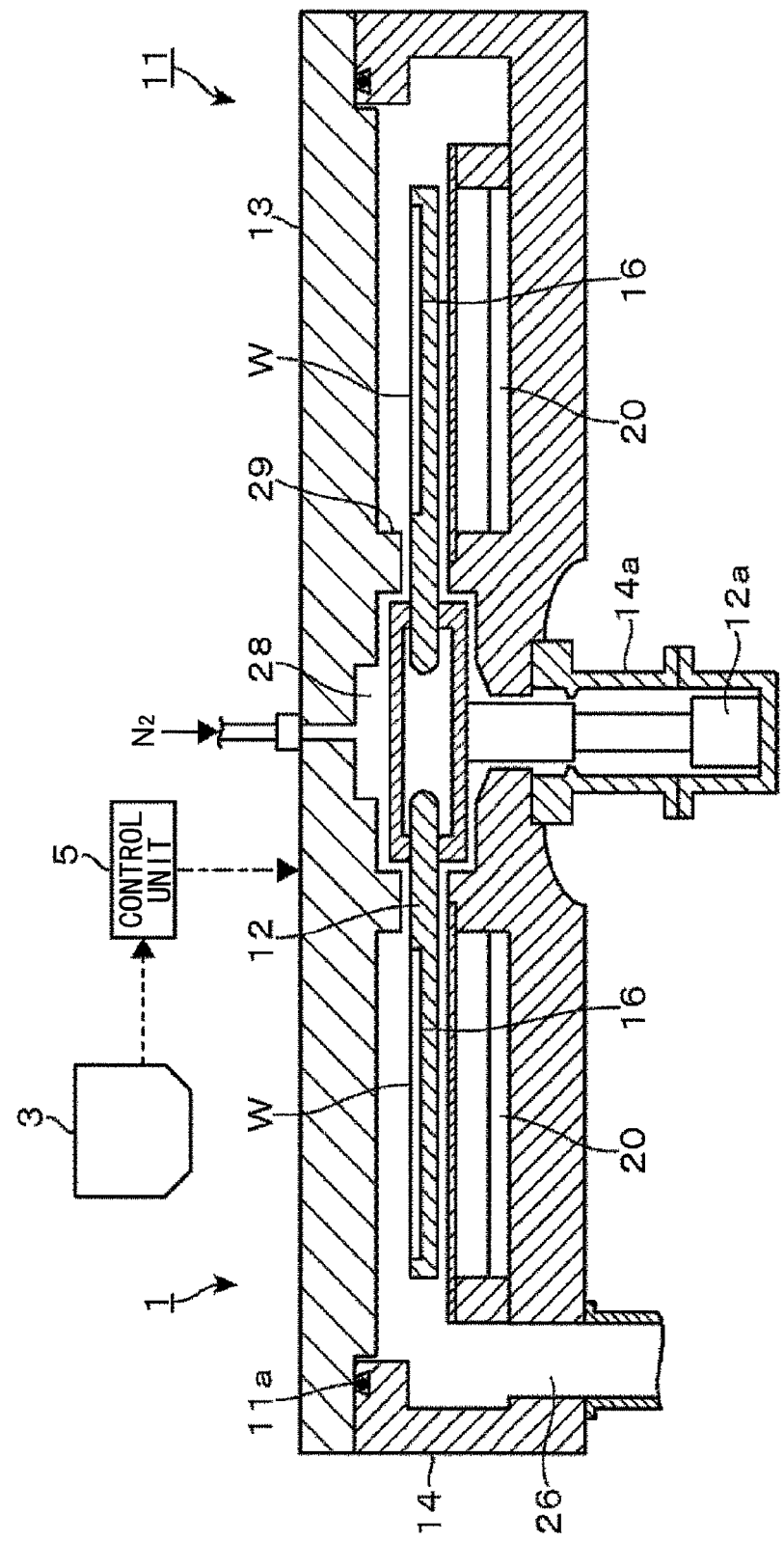
FIG. 1 is a cross-sectional view of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First, a film deposition apparatus 1 (a heat treatment apparatus) in which a temperature measurement apparatus is incorporated is explained. The film deposition apparatus 1 performs Atomic Layer Deposition (ALD) and Molecular Layer Deposition (MLD) onto a semiconductor wafer (which is a substrate, and hereinafter simply referred to as a wafer) W.

Figure 2:
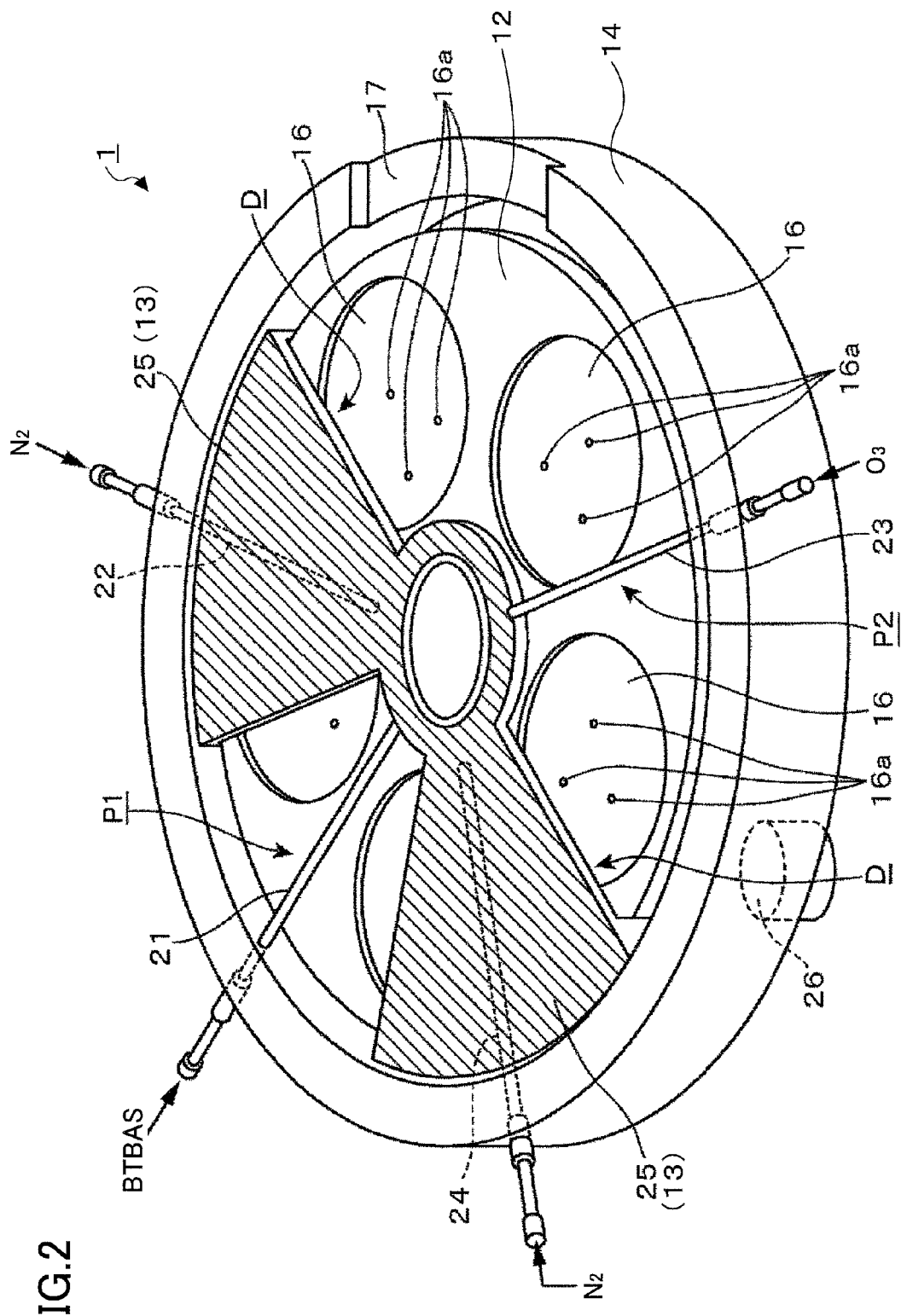
FIG. 2 is a perspective view of the film deposition apparatus.
Figure 3:
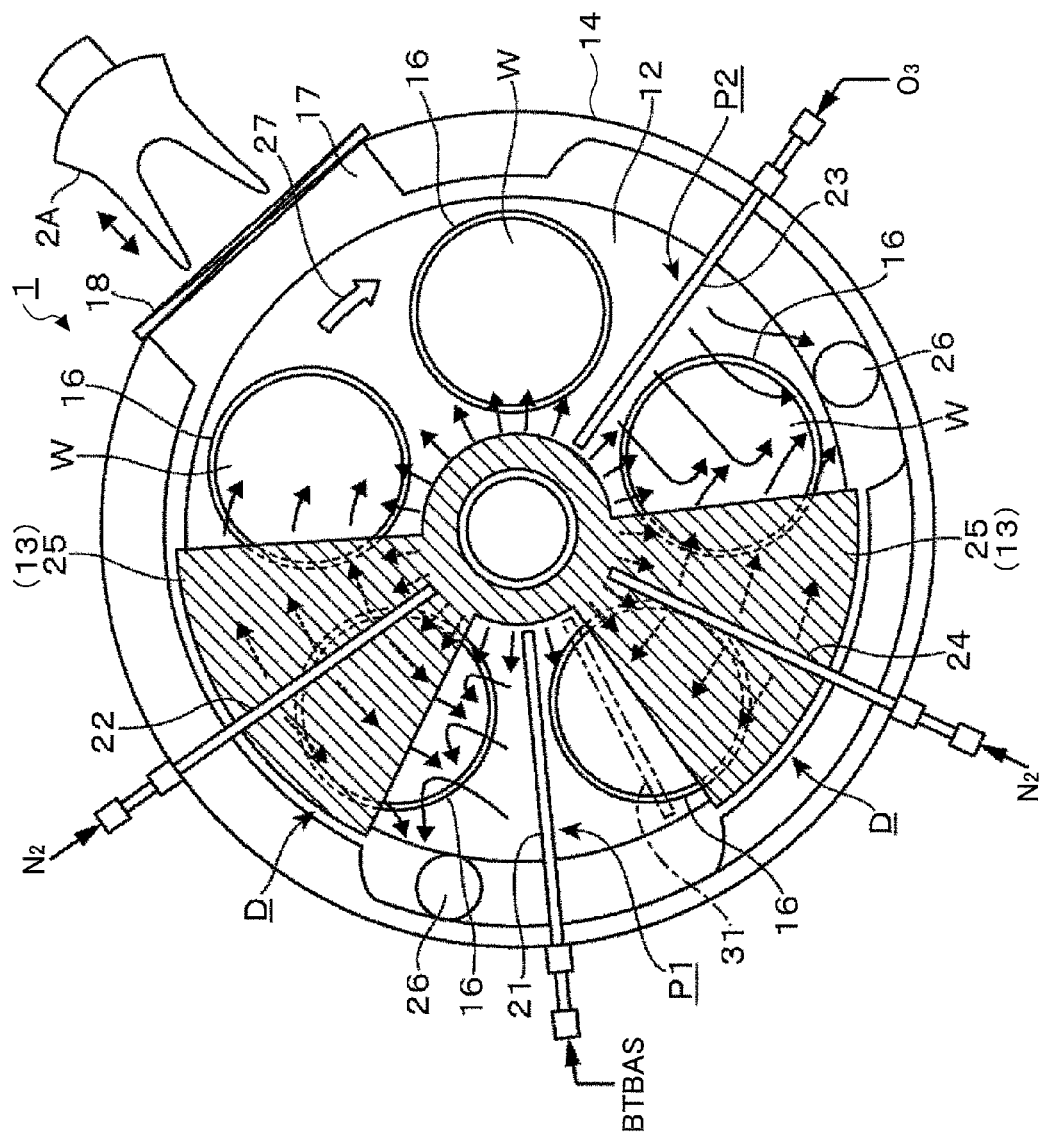
FIG. 3 is a cross-sectional view of a vacuum chamber of the film deposition apparatus taken along a horizontal plane.

FIG. 1 is a cross-sectional view, FIG. 2 is a perspective view, and FIG. 3 is a cross-sectional view taken along a horizontal plane, of the film deposition apparatus 1.

The film deposition apparatus 1 includes a substantially flat circular vacuum chamber 11 (process container), a rotating table 12, a transferring mechanism 2A (see FIG. 3), a rotation drive mechanism 12a, a heater 20, a first reactant gas nozzle 21, a separation gas nozzle 22, a second reactant gas nozzle 23, a separation gas nozzle 24 (see FIG. 2 and FIG. 3), a radiation temperature measurement unit 3 and a control unit 5. Here, the radiation temperature measurement unit 3 and the control unit 5 compose a temperature measurement apparatus.

The rotation drive mechanism 12a rotates the rotating table 12 in a circumferential direction. The transferring mechanism 2A transfers the wafer W. The heater 20 is provided below the rotating table 12.

The vacuum chamber 11 includes a top plate 13 and a container body 14 which composes a side wall and a bottom portion of the vacuum chamber 11. The vacuum chamber 11 is provided in atmosphere, and is configured to keep the inside airtight. The vacuum chamber 11 includes a seal member 11a for keeping the vacuum chamber 11 airtight (see FIG. 1), a cover 14a that blocks a center portion of the container body 14, exhaust ports 26, a transferring port 17 (see FIG. 2 and FIG. 3), and a shutter 18 (see FIG. 3) capable of opening and closing the transferring port 17.

The structure and the operation in heat treatment (deposition of film) of the film deposition apparatus 1 is explained.

The rotating table 12 is horizontally provided in the vacuum chamber 11. The rotating table 12 is provided with five concave portions 16 at its surface along a rotation direction (the circumferential direction) for mounting the wafers W.

As shown in FIG. 3, when the transferring mechanism 2A proceeds into the vacuum chamber 11 from the transferring port 17 while holding a wafer W, elevating pins (not shown in the drawings) are protruded above the rotating table 12 from holes 16a in the concave portion 16, which is positioned to correspond to the transferring port 17, to hold the wafer W transferred by the transferring mechanism 2A. With this, the wafer W is transferred from the transferring mechanism 2A to the concave portion 16 via the elevating pins.

Such a series of operations by the transferring mechanism 2A, the elevating pins and the rotating table 12 are repeated so that wafers W are passed to each of the concave portions 16, respectively.

Then, for example, when the process of the wafers W is finished so that the wafers W are carried out from the vacuum chamber 11, the elevating pins (not shown in the drawings) raise the wafer W in the concave portion 16, which is positioned to correspond to the transferring port 17. Then, the transferring mechanism 2A receives the raised wafer W to carry it outside the vacuum chamber 11.

The first reactant gas nozzle 21, the separation gas nozzle 22, the second reactant gas nozzle 23 and the separation gas nozzle 24 formed in bars and extending from an outer periphery to the center of the rotating table 12, respectively, are provided on the rotating table 12 in this order in the circumferential direction. The gas nozzles 21 to 24 have open ports and supply gas along a radius of the rotating table 12, respectively. In this embodiment, for example, the first reactant gas nozzle 21 outputs bistertialbutylaminosilane (BTBAS) gas as the first reactant gas, the second reactant gas nozzle 23 outputs $O_3$ (ozone) gas as second reactant gas, respectively. The separation gas nozzles 22 and 24 output $N_2$ (nitrogen) gas as separation gas, respectively.

The top plate 13 of the vacuum chamber 11 is provided with two fan-shaped protruding portions 25 protruding downward which are provided with a space therebetween in the circumferential direction. The separation gas nozzles 22 and 24 are embedded in the protruding portions 25 respectively so as to divide the corresponding protruding portion 25 in the circumferential direction. The first reactant gas nozzle 21 and the second reactant gas nozzle 23 are provided to be apart from the protruding portions 25.

The exhaust ports 26 are provided at a bottom surface of the container body 14 to be open at the outer periphery of the rotating table 12.

When wafers W are mounted on the concave portions 16 of the rotating table 12, the vacuum chamber 11 is evacuated from the exhaust ports 26 to be a vacuum. Then, the wafers W are heated to be 350° C., for example, by the heater 20 via the rotating table 12 while the rotating table 12 is being rotated. An arrow 27 shown in FIG. 3 shows the rotating direction of the rotating table 12.

Subsequently, the gas is supplied from the gas nozzles 21 to 24, respectively, and the wafers W alternately pass through a first processing area 21 under the first reactant gas nozzle 21 and a second processing area P2 under the second reactant gas nozzle 23. With this operation, BTBAS gas and subsequently $O_3$ gas are adsorbed on the wafers W. Therefore, BTBAS molecules deposited on the wafers W are oxidized to foam a single or plural of silicon oxide molecular layer(s), respectively. Then, the silicon oxide molecular layers are stacked in order so that a silicon oxide layer with a predetermined thickness is formed on each of the wafers W.

When depositing layers, $N_2$ gas which is the separation gas supplied to the separation areas D from the nozzles 22 and 24 spreads in the separation areas D in the circumferential direction to prevent mixing of BTBAS gas and $O_3$ gas on the gas rotating table 12 and flow excess BTBAS gas and $O_3$ gas toward the exhaust ports 26. Further, when depositing layers, $N_2$ gas is supplied to a space 28 above the center portion of the rotating table 12. The $N_2$ gas supplied to the space 28 is further supplied to the outer periphery of the rotating table 12 in the radius direction through a lower portion of a protruding portion 29 in a ring-form which protrudes downward. Thus, BTBAS gas and $O_3$ gas in the center portion can be prevented from being mixed. In FIG. 3, flows of each of the gas when depositing layers are expressed by arrows. Further, although not shown in the drawings, $N_2$ gas is also supplied into the cover 14a and to a back surface side of the rotating table 12 to purge the reactant gas.

Then, a method of measuring a temperature profile of surfaces of the wafers W by the radiation temperature measurement unit 3 of the film deposition apparatus 1 of the embodiment is explained.

Figure 4:
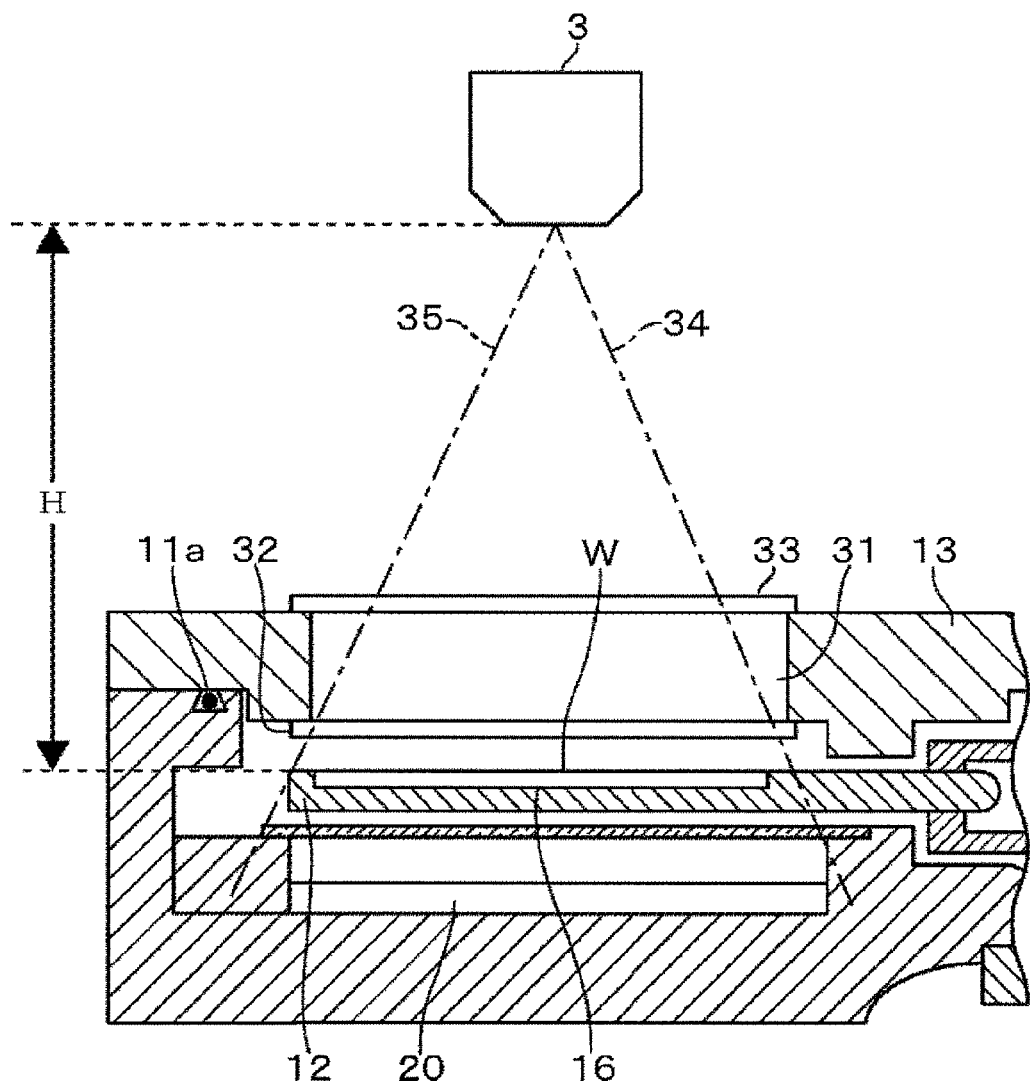
FIG. 4 is a view for explaining a temperature measurement area of a temperature measurement unit.

FIG. 4 is a cross-sectional view partially showing the top plate 13 and the rotating table 12. The explanation is made with reference to FIG. 4 as well. FIG. 4 corresponds to a cross-sectional view taken along a slit 31 shown as a chain line between the gas nozzle 21 and the separation gas nozzle 24 in FIG. 3.

The top plate 13 is provided with the slit 31 which is opened at a position shown by the chain line in FIG. 3 to be extended in the radius direction of the rotating table 12. The slit 31 is provided to correspond to at least a diameter of each of the concave portions 16 provided in the rotating table 12, in the radius direction. The slit 31 may be provided to correspond to a radius of the rotating table 12 in the radius direction.

The film deposition apparatus 1 further includes a lower transparent plate 32 and an upper transparent plate 33 which are provided to cover the slit 31 at the upper side and the lower side, respectively. The lower transparent plate 32 and the upper transparent plate 33 are made of a material which is capable of transmitting an infrared ray radiated from the surface of the rotating table 12 as well as capable of keeping inside the vacuum chamber 11 airtight, such as sapphire or the like, for example. With this structure, the radiation temperature measurement unit 3 can measure the temperature of the surface of the rotating table 12 (including the surfaces of the wafers W). Therefore, in this embodiment, the temperature of the surfaces of the wafers W can be measured while keeping the vacuum chamber 11 airtight.

The radiation temperature measurement unit 3 is a noncontact thermometer. The radiation temperature measurement unit 3 is provided above the slit 31. In this embodiment, a height "H", shown in FIG. 4, from the surface of the rotating table 12 to a lower end of the radiation temperature measurement unit 3 may be 500 mm, for example. In this embodiment, the radiation temperature measurement unit 3 is configured to be capable of scanning the surface of the rotating table 12 in the radius direction of the rotating table 12 for measuring temperature of plural positions of the rotating table 12 along the radius direction.

Figure 5:
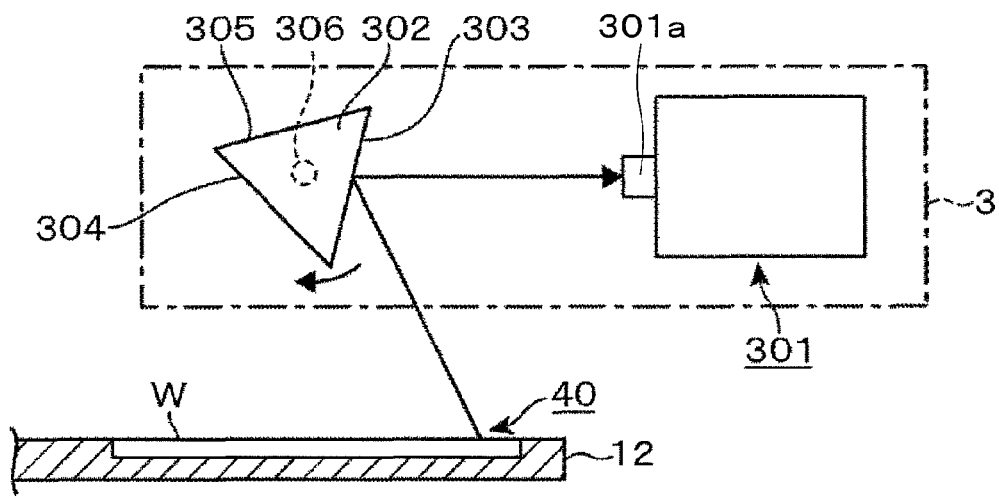
FIG. 5 is a schematic view of the temperature measurement unit.
Figure 6:
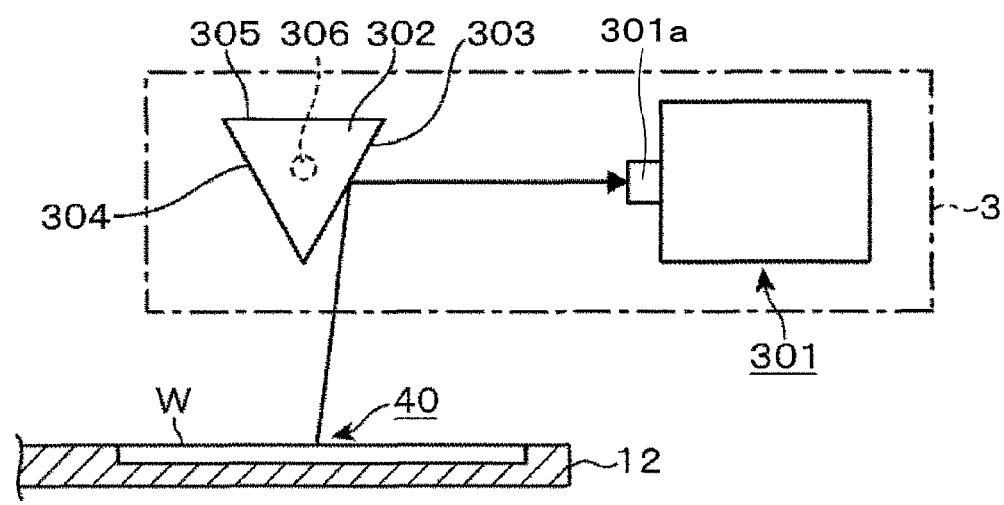
FIG. 6 is a schematic view of the temperature measurement unit.
Figure 7:
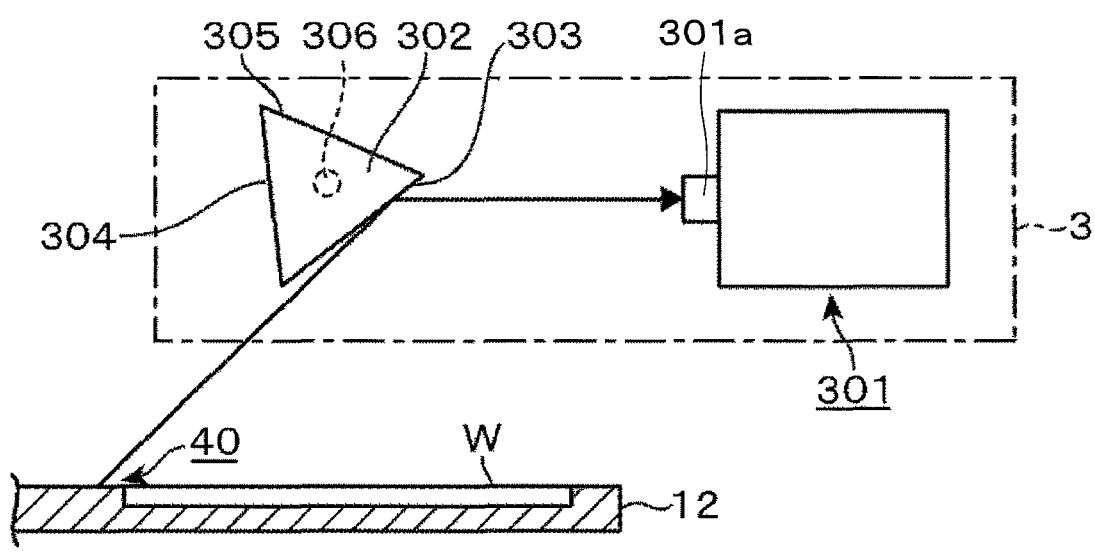
FIG. 7 is a schematic view of the temperature measurement unit.

FIG. 5 to FIG. 7 show schematic views of the radiation temperature measurement unit 3.

The radiation temperature measurement unit 3 includes a rotating body 302 including reflection planes 303 to 305 and a detection unit 301 including a light receiver 301a that receives the infrared ray.

The detection unit 301 is an infrared ray sensor that receives the infrared ray, and calculates a measured temperature value based on the amount of the received infrared ray. In this embodiment, the light receiver 301a of the detection unit 301 receives the infrared ray which is reflected by either of the reflection planes 303 to 305 of the rotating body 302.

In this embodiment, the rotating body 302 is formed to be a triangle in a plane view where three surfaces of the triangle function as the reflection planes 303 to 305, respectively. As shown in FIG. 5, the rotating body 302 is rotated in a direction shown by an arrow while having a rotating shaft 306 as the center of rotation. Here, the rotating body 302 may be, for example, composed of a servomotor which rotates at a predetermined speed, 50 Hz, for example.

Each of the reflection planes 303 to 305 of the rotating body 302 are configured to be capable of reflecting the infrared ray radiated from the surface of the rotating table 12 under the slit 31 of the top plate 13 when the corresponding reflection plane (303 to 305) is positioned to face the light receiver 301a of the detection unit 301.

The detection unit 301 is configured and placed such that the light receiver 301a is capable of receiving the infrared ray reflected by either of the reflection planes 303 to 305 of the rotating body 302.

With this structure, the infrared ray, radiated from an area on the rotating table 12 which is determined by a relative position between one of the reflection planes 303 to 305 which is positioned to face the light receiver 301a of the detection unit 301 and the light receiver 301a of the detection unit 301, is received by the light receiver 301a of the detection unit 301. This area on the rotating table 12 is referred to as a temperature measurement area 40, hereinafter. For an example shown in FIG. 5 to FIG. 7, the reflection plane 303 of the rotating body 302 is positioned to face the light receiver 301a of the detection unit 301. Thus, an area at the surface of the rotating table 12 which is reflected by a portion, positioned at the same height as the light receiver 301a, of the reflection plane 303 is determined as the temperature measurement area 40.

The detection unit 301 calculates a measured temperature value which is in accordance with the received amount of the infrared ray based on the received amount of the infrared ray. The measured temperature value calculated by the detection unit 301 is sequentially sent to the control unit 5 (FIG. 1).

Further in this embodiment, the rotating body 302 is configured such that when each of the reflection planes 303 to 305 is placed to face the light receiver 301a of the detection unit 301, the temperature measurement area 40 which is reflected by the corresponding reflection plane (303, 304 or 305) moves from an inner side to an outer side of the surface of the rotating table 12 in the radius direction. It means that, in this embodiment, each of the reflection planes 303 to 305 of the rotating body 302 are structured to correspond to a length of the rotating table 12 between the inner side to the outer side in the radius direction. With this structure, regular and continuous scanning from the inner side to the outer side of the rotating table 12 in the radius direction can be performed. Therefore, high-speed scanning can be possible. Further, as the scanning can be performed at a high speed, the scanning from the inner side to the outer side of the rotating table 12 in the radius direction can be performed regardless of the rotation speed of the rotating table 12. Therefore, it is possible to appropriately measure the temperature of the surface of the rotating table 12 in all cases such as when the rotating table 12 is immobilized, when the rotating table 12 is rotated at a low speed, and when the rotating table 12 is rotated at a high speed.

Further, although the rotating body 302 is formed to be a triangle in a plane view in this embodiment, the rotating body 302 may be formed to be a polygon, other than a triangle, provided that each of the reflection planes of the rotating body 302 are structured to correspond to the length of the rotating table 12 between the inner side to the outer side in the radius direction.

As shown in FIG. 5, the reflection plane 303 is being positioned to face the light receiver 301a of the detection unit 301. Under this state, when the rotating body 302 is rotated around the rotating shaft 306, the angle between a surface of the reflection plane 303 and the surface of the rotating table 12 generally changes as shown in FIG. 6 and FIG. 7 so that the temperature measurement area 40 at the surface of the rotating table 12, including the wafers W, shifts from the inner side (right-side in FIG. 5 to FIG. 7) to the outer side (left-side in FIG. 5 to FIG. 7) of the rotating table 12. Then, when the temperature measurement area 40 at the surface of the rotating table 12 reaches the most outer side of the rotating table 12, the interface between the reflection plane 303 and the reflection plane 305 is positioned to be the same height as the light receiver 301a. Subsequently, the reflection plane that is positioned to face the light receiver 301a of the detection unit 301 changes from the reflection plane 303 to the reflection plane 305 so that the angle between a surface of the reflection plane (303 or 305) and the surface of the rotating table 12 suddenly changes. Therefore, the temperature measurement area 40 at the surface of the rotating table 12 is moved to the inner side again.

When the rotating body 302 is rotated around the rotating shaft 306 under this state, the temperature measurement area 40 at the surface of the rotating table 12 shifts from the inner side to the outer side of the rotating table 12 in the radius direction again. In this embodiment, repeating this operation, the radiation temperature measurement unit 3 can continuously and repeatedly perform the scanning from the inner side to the outer side of the rotating table 12 in the radius direction.

Further, the detection unit 301 is configured such that temperature of 128 areas on the surface of the rotating table 12 in the radius direction can be obtained by continuously absorbing the infrared ray 128 times from each of the reflection planes 303 to 305 of the rotating body 302 while the rotating body 302 is being rotated. This means that the detection unit 301 is configured to measure the temperature of 128 of the temperature measurement areas 40 in a single scanning operation.

In this embodiment, when the rotating body 302 is composed of a servomotor which rotates at 50 Hz as described above, for example, as the rotating body 302 includes three reflection planes 303 to 305, the scanning speed of the radiation temperature measurement unit 3 from the inner side to the outer side of the rotating table 12 becomes 150 Hz. This means that the radiation temperature measurement unit 3 can perform the scanning 150 times per second.

Further, the radiation temperature measurement unit 3 may be configured to have a diameter of the temperature measurement area 40 become 5 mm, for example.

The radiation temperature measurement unit 3 may be configured to be capable of scanning a range at the rotating table 12 from the inner side of the concave portions 16 to an end of the outer periphery of the rotating table 12. Chain lines 34 and 35 in FIG. 4 show infrared rays to the radiation temperature measurement unit 3 radiated from the temperature measurement area 40 at the most inner side and at the most outer periphery side of the rotating table 12, respectively.

In this embodiment, the rotating table 12 is rotated while the radiation temperature measurement unit 3 performs scanning.

Figure 8:
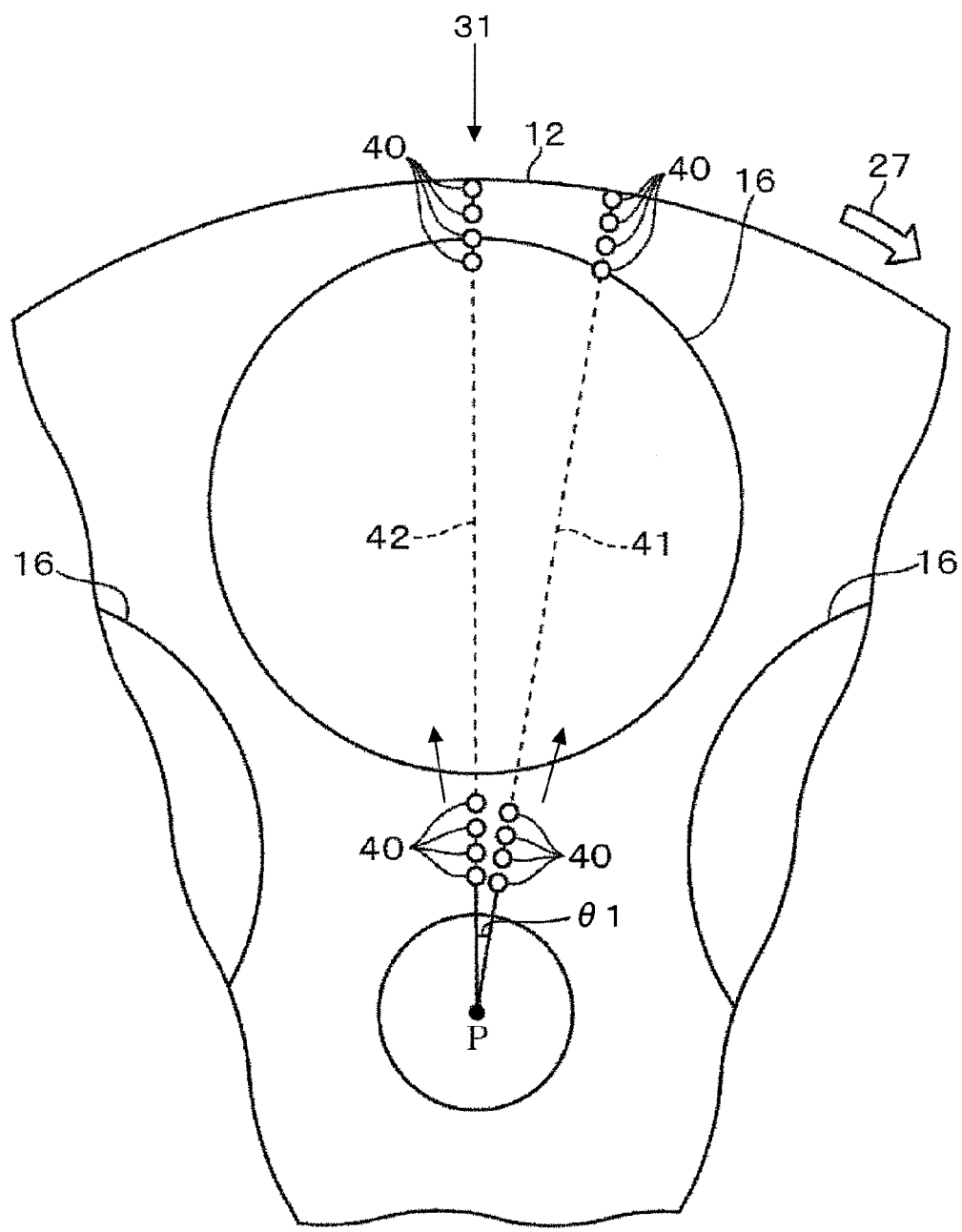
FIG. 8 is a schematic view showing temperature measurement areas.

FIG. 8 is a schematic view showing a relationship between the rotating table 12 and the temperature measurement areas 40.

The radiation temperature measurement unit 3 scans the rotating table 12 below the slit 31 of the top plate 13 from the inner side to the outer side of the rotating table 12 in the radius direction of the rotating table 12.

For example, when it is assumed that an area of the rotating table 12 shown by a line 41 is positioned below the slit 31 of the top plate 13 in "n"th ("n" is an integer) scanning, the radiation temperature measurement unit 3 scans the rotating table 12 on the line 41 from the inner side to the outer side to measure the temperature of the plural temperature measurement areas 40. Subsequently, when it is assumed that the rotating table 12 is rotated in a direction shown by an arrow 27, an area of the rotating table 12 shown by a line 42 is positioned below the slit 31 of the top plate 13 in "n+1"th ("n" is an integer) scanning. At this time, the radiation temperature measurement unit 3 scans the rotating table 12 on the line 42 from the inner side to the outer side to measure the temperature of the plural temperature measurement areas 40. FIG. 8 shows this status.

As described above, when the detection unit 301 is configured to absorb the infrared ray for 128 times by each of the reflection planes 303 to 305 of the rotating body 302 while the rotating body 302 is being rotated, there exist 128 temperature measurement areas 40 on each of the lines 41 and 42.

By the rotation of the rotating table 12, the lines 41 and 42 are shifted for an angle corresponding to the rotation speed of the rotating table 12 while having a rotation center "P" as the center. As described above, by repeating the scanning while rotating the rotating table 12, the measured temperature values of the plural areas at the surface of the rotating table 12 can be obtained.

With this, the temperature at the plural areas at the surface of the rotating table 12 in the circumferential direction can be measured by the radiation temperature measurement unit 3.

Figure 9:
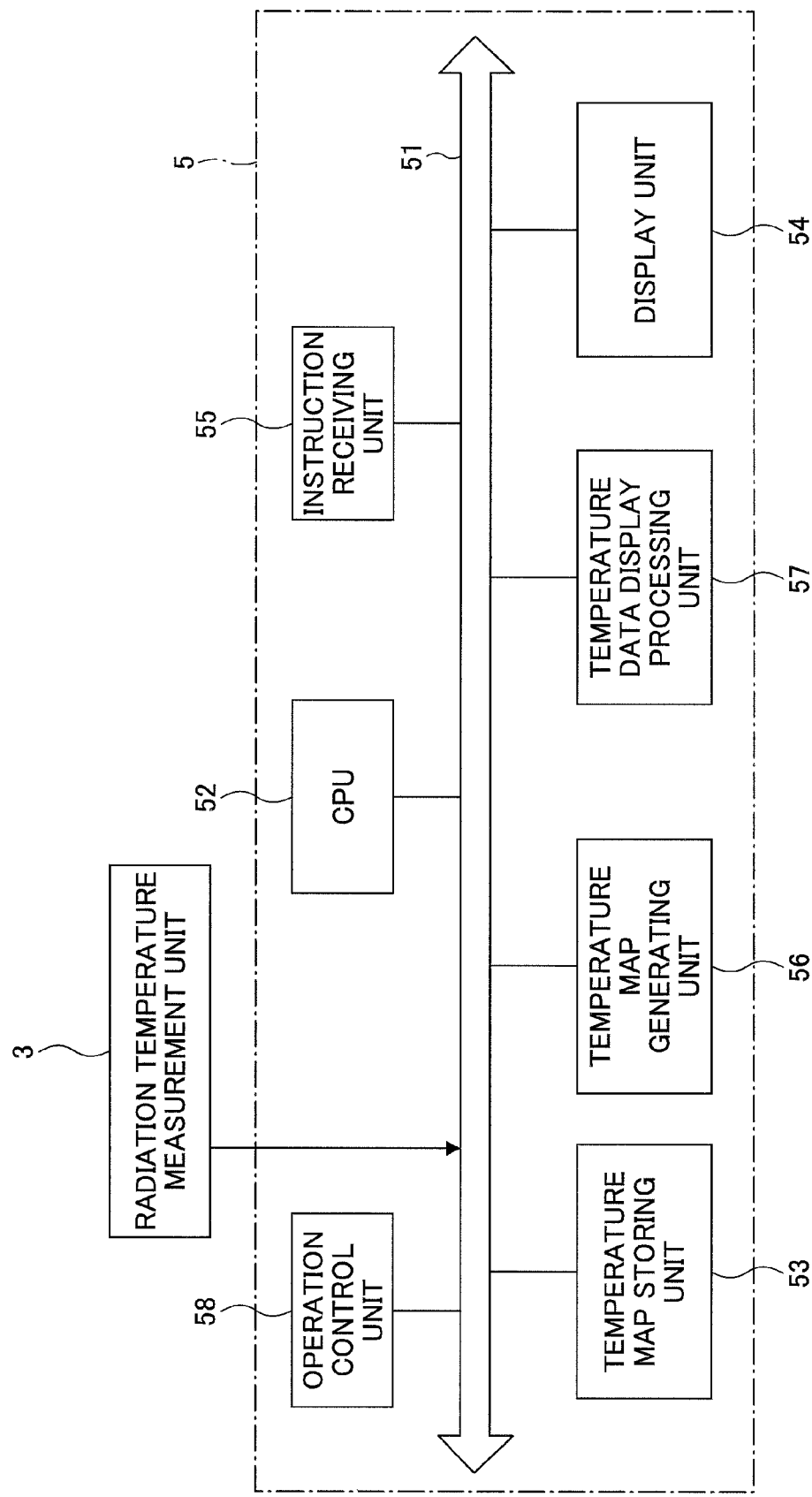
FIG. 9 is a block diagram of a control unit of the film deposition apparatus.

Next, the structure of the control unit 5, which is a computer provided to the film deposition apparatus 1, is explained with reference to a block diagram shown in FIG. 9.

The control unit 5 includes a bus 51, a CPU 52, a temperature map storing unit 53, a display unit 54, an instruction receiving unit 55, a temperature map generating unit 56, a temperature data display processing unit 57, and an operation control unit 58. Here, the instruction receiving unit 55, the temperature map generating unit 56, the temperature data display processing unit 57, and the operation control unit 58 correspond to functional blocks of the control unit 5 which are actualized by the CPU 52 and programs executed by the CPU 52. Although not shown in the drawings, the control unit 5 includes a storing unit that stores these programs.

The radiation temperature measurement unit 3, the CPU 52, the temperature map storing unit 53, the display unit 54, the instruction receiving unit 55, the temperature map generating unit 56, the temperature data display processing unit 57 and the operation control unit 58 are connected to the bus 51. The temperature map storing unit 53 is a memory that stores temperature map data (temperature data) in which addresses (positions) of the rotating table 12 and the measured temperature values correspond with each other, as will be explained later.

The display unit 54 displays image data indicating the temperature profile at the surface of the rotating table 12, graph data indicating a relationship between the addresses of the rotating table 12 in the radius direction and the temperature, graph data indicating a relationship between an average temperature value of the rotating table 12 at a certain angle and time, or the like.

The instruction receiving unit 55 receives an instruction from a user based on a predetermined operation by the user. In this embodiment, the instruction receiving unit 55 also functions as a display style selection receiving unit that receives a selection of a display style for data related to the temperature profile. Here, the display style may include a style in which a color image of a color spot corresponding to the temperature at the surface of the rotating table 12, a style in which a graph indicating a relationship between the addresses of the rotating table 12 in the radius direction and the temperature, a style in which a graph indicating a relationship between an average temperature value of the rotating table 12 at a certain angle and time, or the like.

The temperature map generating unit 56 may be actualized by a program that generates a temperature map based on the above described measured temperature values obtained from the radiation temperature measurement unit 3.

The temperature data display processing unit 57 may be actualized by a program capable of displaying the above described styles based on the display style appointed by the user and received by the instruction receiving unit 55.

For the programs for actualizing the temperature map generating unit 56 and the temperature data display processing unit 57, steps or orders are embedded to be capable of instructing to generate the temperature map, display the data on the display unit 54 or the like.

The operation control unit 58 controls operations of components of the film deposition apparatus 1. In this embodiment, the operation control unit 58 may be actualized by a program in which steps or orders for controlling the operations of the components for measuring the temperature profile of the wafers W mounted on the rotating table 12 in the vacuum chamber 11 of the film deposition apparatus 1 are embedded.

These programs (including programs related to an input operation of process parameters and a display) are stored on a computer recording medium such as a flexible disk, a compact disk, a hard disk, a magneto-optical disk (MO), a memory card or the like, for example, and are installed in the control unit 5.

Figure 10:
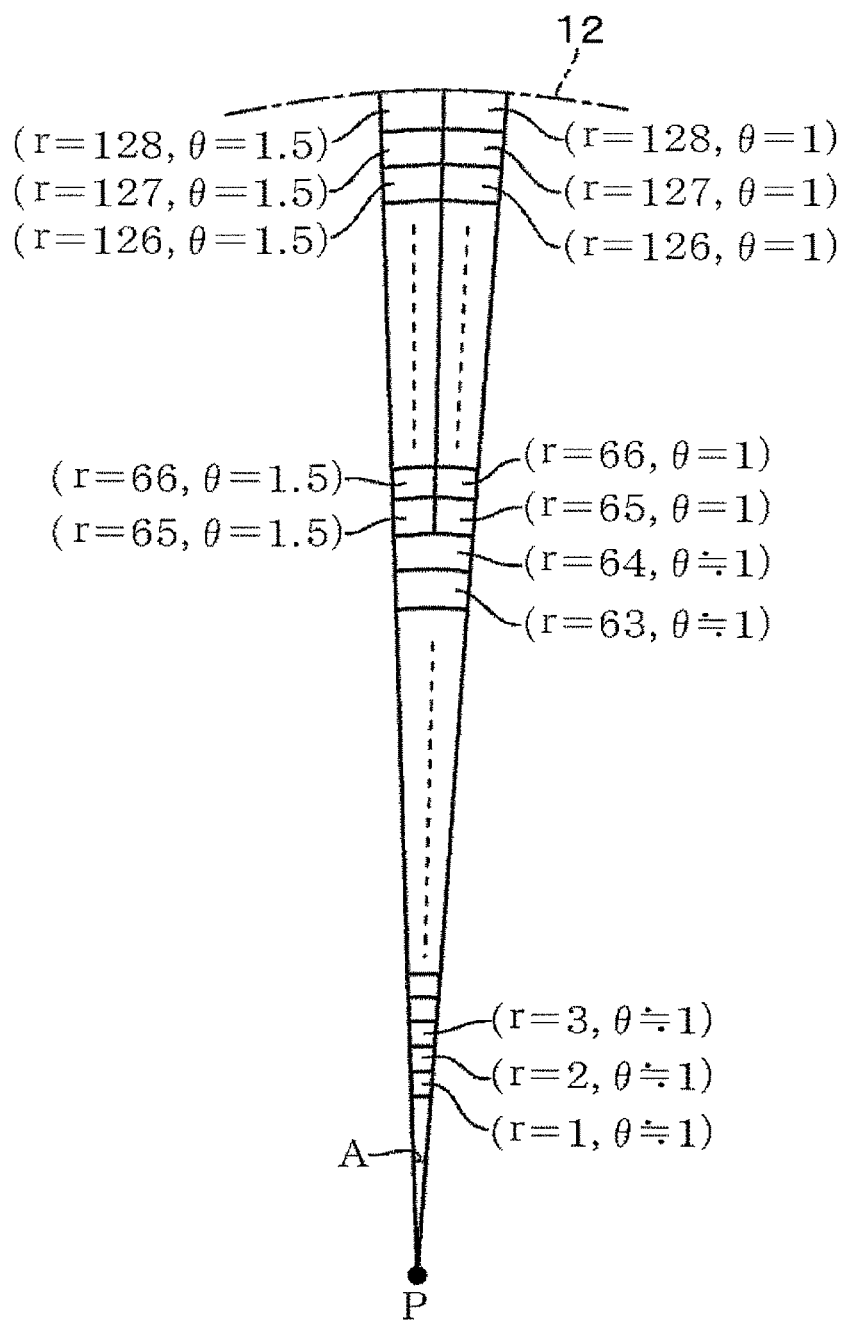
FIG. 10 is a schematic view showing addresses of a rotating table.

The addresses allocated to the surface of the rotating table 12 for generating the temperature map data are explained. FIG. 10 shows an example.

The addresses are defined by a polar coordinate composed of a radius coordinate "r" that specifies a position of the rotating table 12 in the radius direction and an angle coordinate "θ" that specifies the position of the rotating table 12 in the circumferential direction. The temperature map generating unit 56 generates the temperature map data by coordinating the measured temperature value obtained by the radiation temperature measurement unit 3 for each of the temperature measurement areas 40 with the address corresponding to the temperature measurement area 40. As described above, the radiation temperature measurement unit 3 detects the temperature of 128 areas in the radius direction in single scanning. Thus, for the radius coordinates "r" of the temperature measurement areas 40, values 1 to 128 are allocated. When the value of the radius coordinate "r" is small, it means that the corresponding temperature measurement area 40 is positioned at the inner side of the rotating table 12.

Further in this embodiment, the addresses of the surface of the rotating table 12 in the circumferential direction may be set for every 0.5° (which will be referred to as a divided angle as well, hereinafter). It means that the angle coordinates are allocated for every 0.5° while having the rotation center P of the rotating table 12 as a center. Thus, for the angle coordinates "θ" of the temperature measurement areas 40, values of every 0.5 between 0 to 355.5 are allocated. The divided angle of 0.5° is just an example and is not limited so. The value of the angle coordinate "θ" becomes larger as it goes to the upper stream of the rotation direction of the rotating table 12. The area adjacent to that having the angle coordinate "θ" as θ=0 at a downstream of the rotation direction of the rotating table 12 has the angle coordinate "θ" as θ=355.5.

FIG. 10 shows addresses of the rotating table 12 where the radius coordinate "r" takes 1 to 128 and the angle coordinate "θ" takes 1 and 1.5.

As shown in FIG. 10, when it is closer to the rotation center P, a distance between adjacent addresses of the rotating table 12 in the circumferential direction becomes shorter. Thus, the angle coordinates "θ" are allocated to take either of θ=1 and 1.5 at a range where the radius coordinate "r" is from 65 to 128, however, the angle coordinates "θ" are allocated to take only θ=1 at a range where the radius coordinate "r" is from 1 to 64. For areas other than θ=0.5 to 1, similarly, it is handled that the angle coordinates "θ" are allocated to take θ=m even when θ=m+0.5 ("m" is integer) at a range where the radius coordinate "r" is from 1 to 64. Here, in FIG. 10, the angle "A" is shown to be larger than it actually should be (1°) for explanation.

Figure 11:
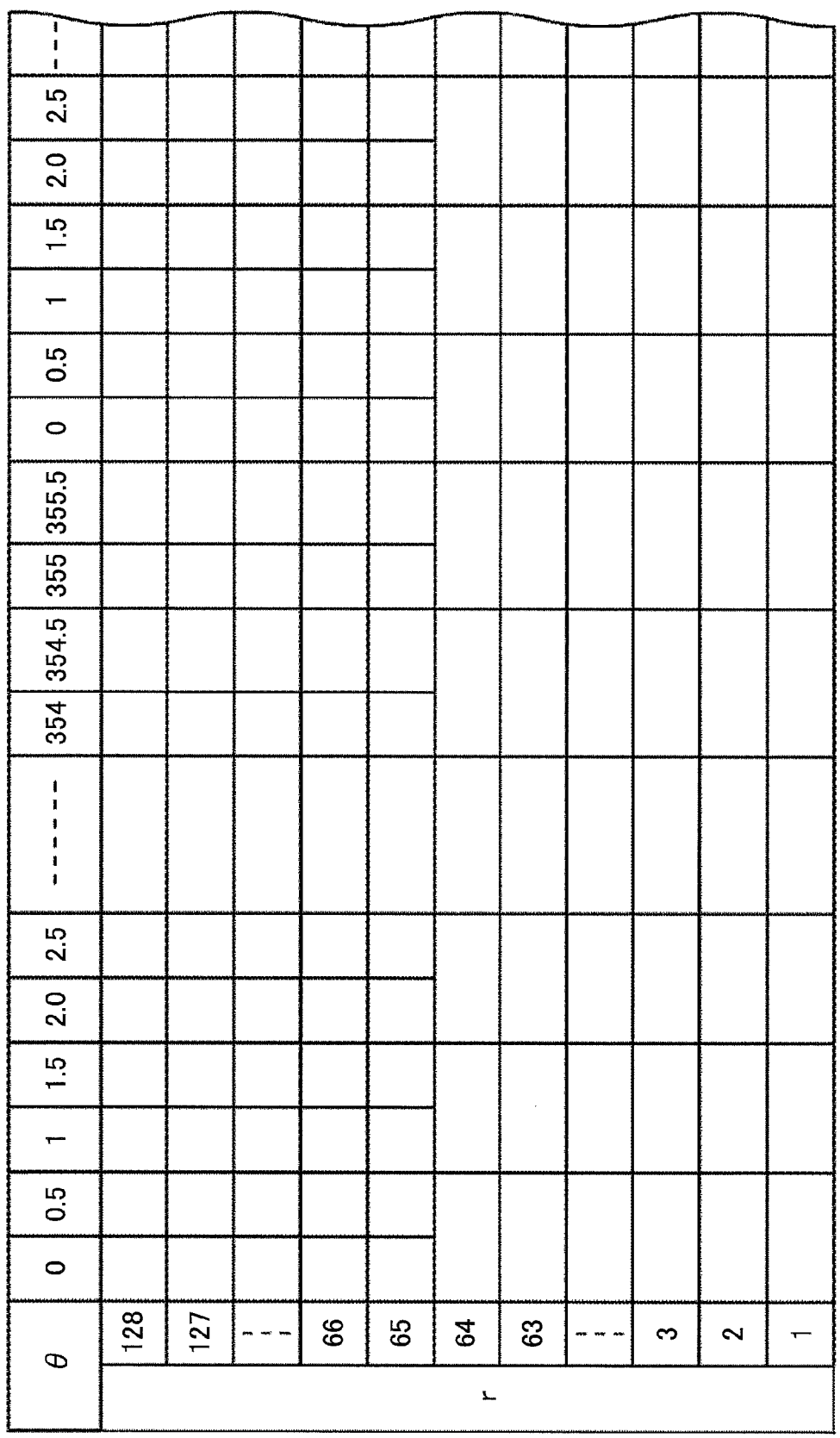
FIG. 11 is a diagram showing an example of a structure of temperature map data stored in a temperature map storing unit.

FIG. 11 is a diagram showing an example of a structure of the temperature map data stored in the temperature map storing unit 53.

In the temperature map data, the measured temperature value detected by the radiation temperature measurement unit 3 corresponds with a region specified by the address (r, θ) which is in accordance with the temperature measurement area 40 where the measured temperature value is obtained.

The correspondence of the temperature measurement area 40 with the address (r, θ) is explained.

In this embodiment, the temperature map generating unit 56 is configured to obtain a clock signal of the control unit 5, the rotation speed of the rotating table 12, and the time when the measured temperature value is obtained from the starting of the measurement.

The temperature map generating unit 56 specifies the radius coordinate "r" by counting the number of the measured temperature values sent from the radiation temperature measurement unit 3 from the start of measurement, based on the clock signal of the control unit 5. For example, for the measured temperature value sent from the radiation temperature measurement unit 3 first after the measurement is started, the radius coordinate "r" becomes r=1, for the 125th measured temperature value sent from radiation temperature measurement unit 3, the radius coordinate "r" becomes r=125, and for the 225th measured temperature value sent from radiation temperature measurement unit 3, the radius coordinate "r" becomes r=225−128=97.

The temperature map generating unit 56 specifies the angle coordinate "θ" based on the clock signal of the control unit 5 and the rotation speed of the rotating table 12.

For example, for the measured temperature values sent from the radiation temperature measurement unit 3 in a first scanning operation after the measurement is started, the angle coordinate "θ" becomes θ=0. Here, θ=0 means a position where the slit 31 is provided, as explained with reference to FIG. 3 and FIG. 4. Then, the temperature map generating unit 56 specifies the angle coordinate "θ" for the measured temperature values sent from the radiation temperature measurement unit 3 in the next scanning operation based on the clock signal of the control unit 5 and the rotation speed of the rotating table 12.

The temperature map generating unit 56 stores the measured temperature value in correspondence with "θ", "r", and the time from the starting of the measurement when the measured temperature value is obtained.

In other words, when it is assumed that the generation of the temperature map data is performed for 1 minute and the rotation speed of the rotating table 12 is 240 cycles/min, 240 groups of temperature map data for 0° to 360° can be continuously obtained. Thus, the temperature map data in accordance with a time from the starting of the measurement can be obtained. Here, as will be explained later, in this embodiment, the scanning speed of the radiation temperature measurement unit 3 is sufficiently fast compared with the rotation speed of the rotating table 12. Therefore, the measured temperature values obtained in the same scanning operation are handled to be obtained at the same time when displaying the measured temperature values as a graph or the like.

Figure 12:
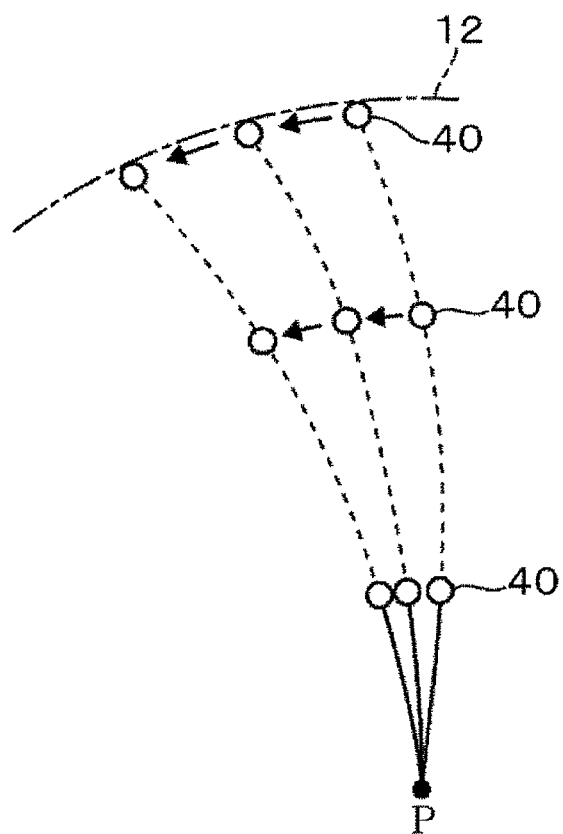
FIG. 12 is a plan view showing the temperature measurement areas.

Here, as the scanning operation by the radiation temperature measurement unit 3 is performed while the rotating table 12 is being rotated, actually, the temperature measurement areas 40 shift like a curve toward an upper stream of the rotation direction of the rotating table 12 while the temperature measurement areas 40 are shifted from the inner side to the outer side of the rotating table 12 in a single scanning operation, as shown in FIG. 12.

However, in this embodiment, a curved amount is not so significant so that the temperature map generating unit 56 is configured to handle that the temperature measurement areas 40 are shifted in a straight line in the radius direction of the rotating table 12 in a single scanning operation as shown in FIG. 4. It means that the temperature map generating unit 56 generates the temperature map data while handling the angle coordinates "θ" for the measured temperature values obtained in a single scanning operation as the same and the angle coordinates "θ" for the radius coordinates "r" of r=2 to 128 in the single scanning operation are the same as that for the radius coordinate "r" of r=1.

Here, as the rotation speed of the rotating table 12 when measuring the temperature is 240 cycles/min as described above, an angle θ1 by the chain lines 41 and 42 shown in FIG. 8 becomes 9.6° which is calculated based on the following equation 1.

θ1="rotation times (cycles or revolutions) of the rotating table 12 per second (cycles/sec)"×360°/"scan speed (Hz)"=240/60×360×1/150=9.6°     (equation 1)

When θ1 is 9.6°, the temperature of the rotation table 12 is measured every 9.6°. In this case, when the rotating table 12 is rotated two cycles (rotated 720°), then, the temperature of the same areas are obtained in the subsequent scanning. In order to generate the temperature map by plural points as many as possible, it is preferable not to measure the temperature of the same areas.

Thus, when generating the temperature map, it is assumed that the rotating table 12 is rotated at a speed, which is similar to the above actual rotation speed (240 cycles/min, in this example) as well as the overlap of the measurement areas hardly occurs, for example, 237.6 cycles/min to solve the overlap in displaying.

When the rotation speed of the rotating table 12 is assumed like this, θ1 becomes as follows based on the equation (1).

θ1=237.6/60×360×1/150=9.504°

This means that the temperature map generating unit 56 stores the measured temperature values in the temperature map data while assuming that after the current single scanning is performed, the measurement areas of the next scanning is shifted θ=9.504° with respect to the measurement areas of the current scanning. Further, as described above, in this embodiment, the divided angle for the angle coordinate "θ" is set as 0.5°. Thus, when the value of "θ" cannot be divided by 0.5, the control unit 5 may approximate the value of "θ" to a value nearest to the original value among values capable of being divided by 0.5.

When the temperature map generating unit 56 generates the temperature map data based on the rotation speed of the rotating table 12 slightly different from the actual rotation speed of the rotating table 12 as described above, the addresses of the temperature measurement areas in the temperature map data are slightly shifted from the actual temperature measurement areas. However, the difference is not significant so that there is no problem in use.

However, this operation of assuming that the rotation speed of the rotating table 12 as 237.6 cycles/min, for example, is not necessarily performed.

The temperature map data generated as described above may be newly generated when the scanning of the radiation temperature measurement unit 3 is started after the scanning is once terminated. The older temperature map data is stored in the temperature map storing unit 53 until a user instructs to delete it or the like.

An example of an operation of measuring the temperature profile of the wafers W by the film deposition apparatus 1 is explained.

Similar to when depositing layers, five wafers W are transferred by the transferring mechanism 2A to be mounted on the concave portions 16, respectively. Here, for measurement of the temperature, four of the five wafers W may be made of SiC (Silicon Carbide), which are similar to those used when depositing layers, and one of the five wafers W may be made of Si (Silicon). The wafer W made of Si is referred to as a wafer W1 hereinafter. The four wafers W made of SiC are referred to as a wafer W2 to a wafer W5 hereinafter.

Under this state, when the instruction receiving unit 55 receives an instruction to start the measurement of temperature of the wafers W by a user, the operation control unit 58 starts rotating of the rotating table 12, and raising the temperature of the heater 20 to heat the wafers W1 to W5, based on the instruction received by the instruction receiving unit 55. After a predetermined period has passed, and the rotation speed of the rotating table 12 becomes 240 cycles/min, the radiation temperature measurement unit 3 repeatedly scans the surface of the rotating table 12 from the inner side to the outer side based on the instruction from the operation control unit 58. The temperature map generating unit 56 coordinates the measured temperature value measured by the radiation temperature measurement unit 3 to an address corresponding to the scanned temperature measurement area 40 to be stored in the temperature map storing unit 53 as the temperature map data.

The operation control unit 58 controls to terminate the scanning operation by the radiation temperature measurement unit 3 and the generation of the temperature map data by the temperature map generating unit 56, when the rotating table 12 is rotated 40 cycles, for example.

The temperature data display processing unit 57 refers to the temperature map data stored in the temperature map storing unit 53 to display the measured temperature values of the scanned temperature measurement areas 40 as color spots, in accordance with the measured temperature values on the display unit 54. In this embodiment, the instruction receiving unit 55 may receive an instruction appointing a time from the starting of the measurement, from the user. The temperature data display processing unit 57 may display the temperature profile of the surface of the rotating table 12 (including the surfaces of the wafers W1 to W5) at the time appointed by the user as the color image.

Figure 13:
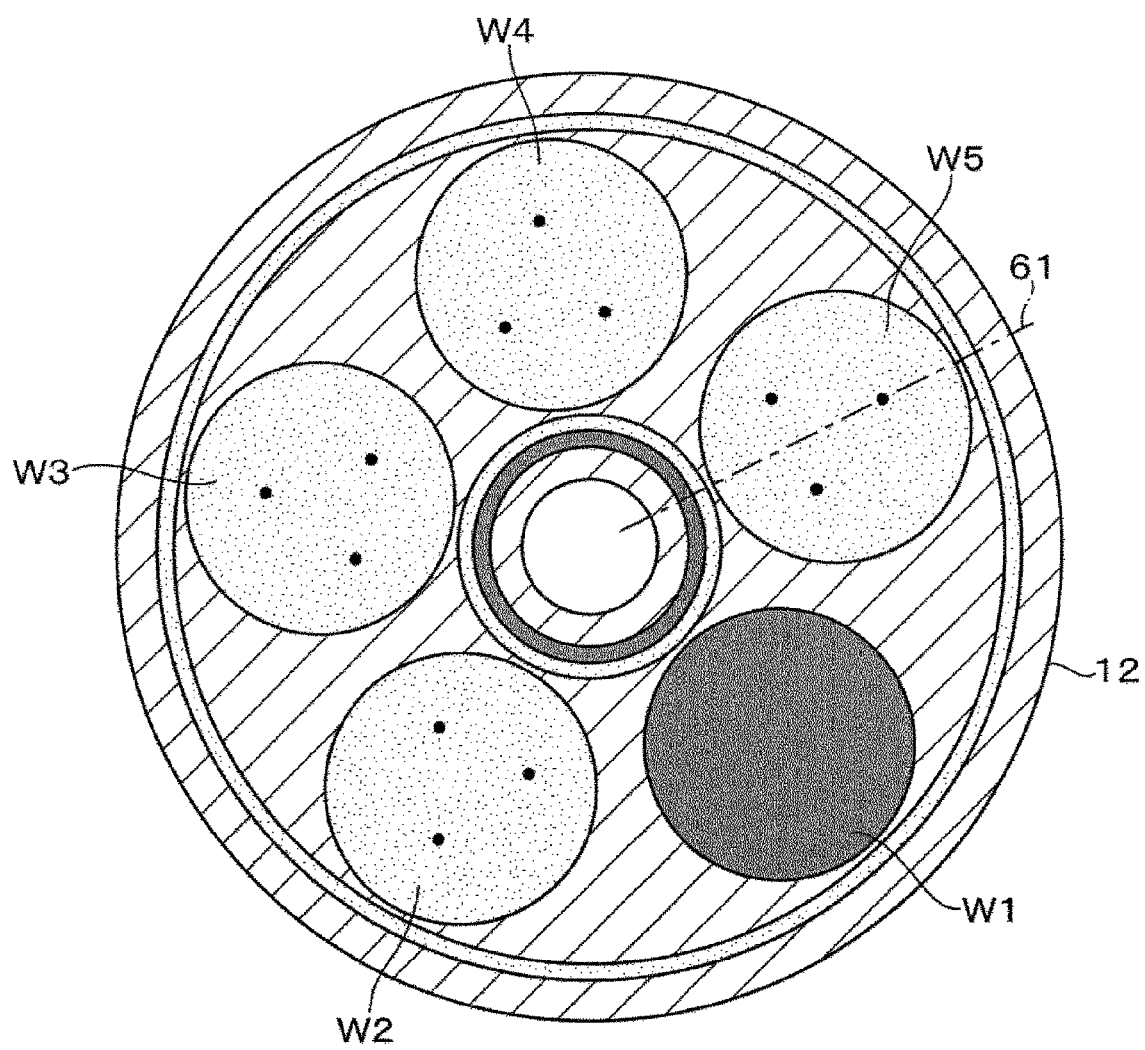
FIG. 13 is a schematic view of an example of a color image displayed by a temperature data display processing unit.

FIG. 13 is a schematic view of an example of a color image displayed by the temperature data display processing unit 57. The color image is shown by a gray-scale gradation for explanation in FIG. 13. Here, the temperature is higher in this order: dense gray>diluted gray>hatched area in FIG. 13.

In this embodiment, the user may appoint the time from the starting of the measurement to be displayed on the display unit 54. The temperature data display processing unit 57 refers to the temperature map data stored in the temperature map storing unit 53 and specifies the measured temperature values which are obtained at and before the time appointed by the user, and displays color spots at the positions corresponding to the addresses of the measured temperature values in accordance with the measured temperature values on the display unit 54 as the color image of the rotating table 12. Here, when the measured temperature values specified by the same address exist from the starting of the measurement until the time appointed by the user, the newer obtained measured temperature value may be output as the color spot.

Here, for the measured temperature values having the same angle coordinate "θ", as the value of "r" of the radius coordinate becomes larger, it is shown as color spots at the outer periphery side of the rotating table 12. As explained above with reference to FIG. 12, by the rotation of the rotating table 12, the temperature measurement areas 40 shift like a curve toward an upper stream of the rotation direction of the rotating table 12 while the temperature measurement areas 40 are shifted from the inner side to the outer side of the rotating table 12 in a single scanning operation. Thus, in this embodiment, the temperature data display processing unit 57 handles that the temperature measurement areas 40 are shifted on a curved line which curves toward the upper stream of the rotation direction while the temperature measurement areas 40 are shifted from the inner side to the outer side of the rotating table 12 in a single scanning operation. With this, an actual temperature profile in the vacuum chamber 11 can be accurately displayed on the display unit 54. The amount of curve may be determined based on the rotation speed of the rotating table 12 when measuring the temperature so that the positions of the measured temperature values substantially correspond with output positions of the color spots, respectively.

Alternatively, the temperature data display processing unit 57 may handle that the temperature measurement areas 40 are shifted in a straight line in the radius direction of the rotating table 12 in a single scanning operation.

Here, the wafer W1 made of Si is heated faster than the wafers W2 to W5 made of SiC so that the position of the wafer W1 in the rotating table 12 can be specified, as shown in FIG. 13. By this specification, the positions of the wafers W2 to W5 in the color image are also specified so that the user can recognize the temperature profile of each of the wafers W1 to W5 in the color image.

Other display styles to be displayed on the display unit 54, in addition to the color image of the rotating table 12 are explained. For example, when a user appoints an arbitrary straight line extending in the radius direction on the color image of the rotating table 12, the temperature data display processing unit 57 may display a graph indicating a temperature profile of the straight line of the rotating table 12 on the display unit 54. For example, after the wafers W1 to W5 are heated as described above, when the user appoints the arbitrary straight line in the radius direction from the color image of the rotating table 12, the instruction receiving unit 55 receives the instruction. The temperature data display processing unit 57 searches the measured temperature values of the addresses to which the appointed "θ" is allocated from the temperature map data stored in the temperature map storing unit 53. Then, the temperature data display processing unit 57 calculates an average value for the measured temperature values which are searched as obtained at the same time. Then, the temperature data display processing unit 57 displays a graph of the average values with respect to time on the display unit 54. For the image shown in FIG. 13, as described above, as the position moves outer ward in the radius direction of the rotating table 12, the measured temperature values at the different "θ" are output as explained with reference to FIG. 12. However, in this embodiment, when displaying the graph of the average values with respect to time, the value of "θ" at the most inner position within an area appointed by the user may be used, for example. Then, the measured temperature values of the addresses of r=1 to 128 at that angle "θ" are read out and the average values are calculated to be shown as the graph.

Figure 14:
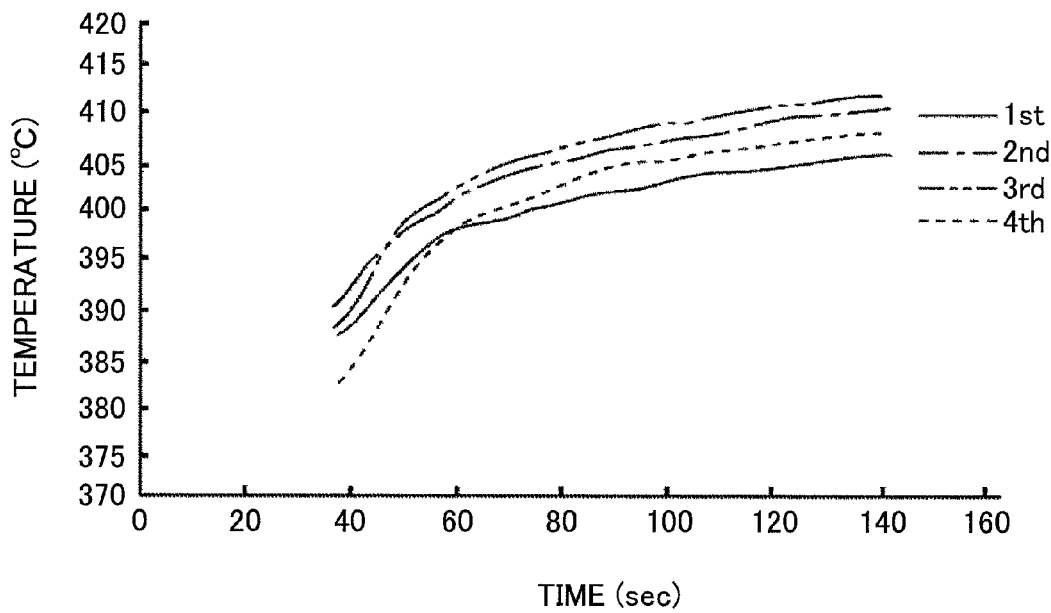
FIG. 14 is a graph showing measured temperature values with respect to time.
Figure 15:
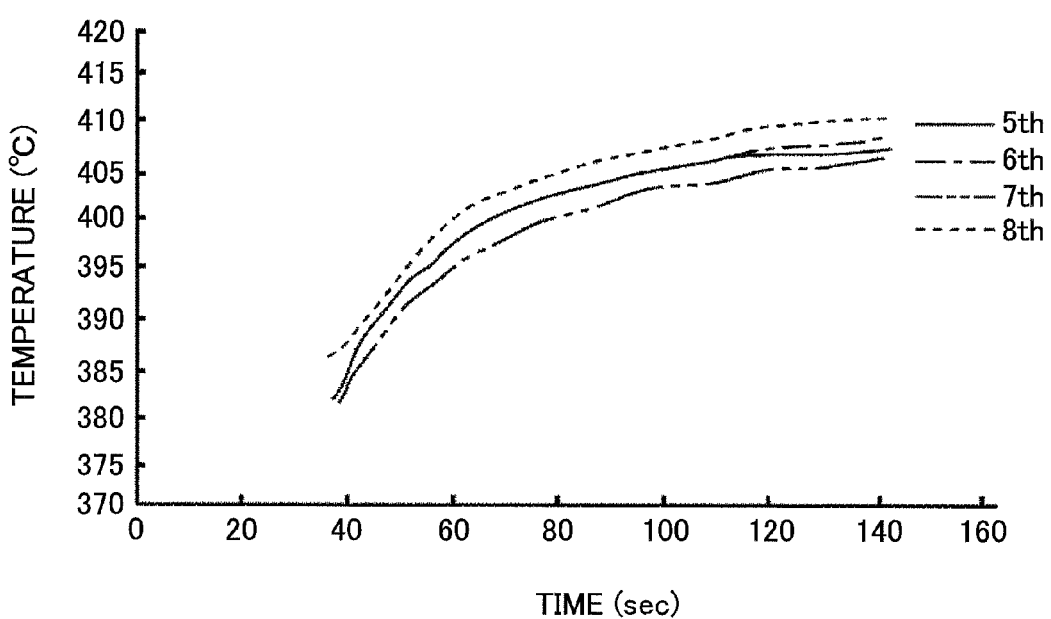
FIG. 15 is a graph showing measured temperature values with respect to time.
Figure 16:
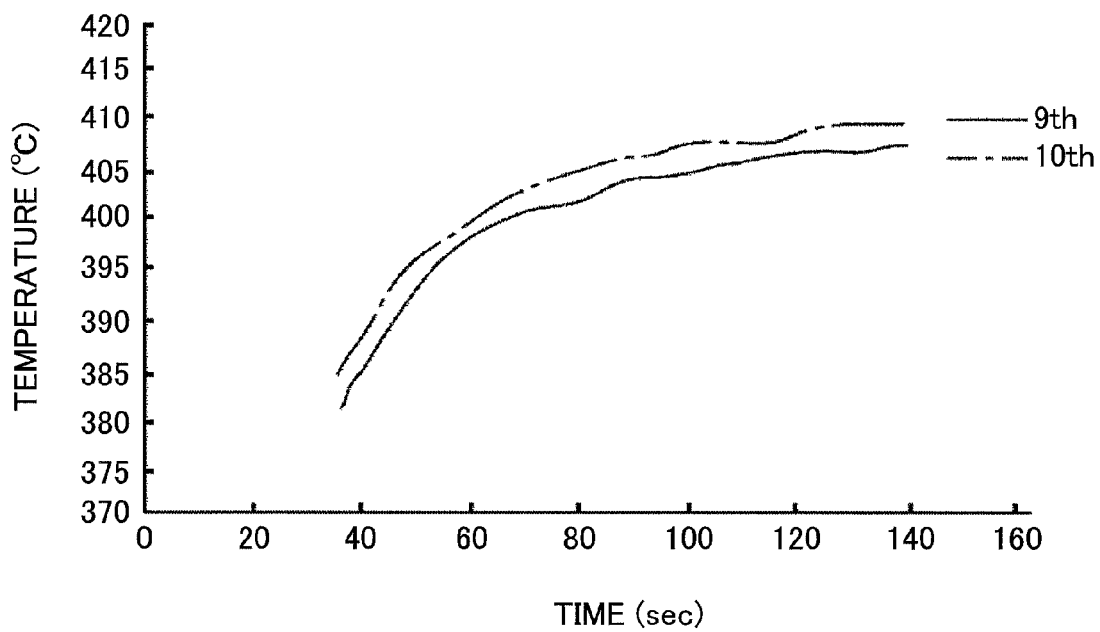
FIG. 16 is a graph showing measured temperature values with respect to time.

FIG. 14 to FIG. 16 are graphs displayed by the temperature data display processing unit 57 where it is assumed that a predetermined angle "θ" shown by a chain line 61 in FIG. 13 is appointed by the user. In this example, the measurement of the temperature is repeated 10 times and each of the temperature profiles is shown. Here, the abscissa axis of the each of the graphs shows the time (second), and the ordinate axis of each of the graphs shows the temperature (° C.). In this example, the time when the rotation of the rotating table 2 is started is set as zero.

The lines of each of the measurements may be shown by color lines of different colors. In FIG. 14 to FIG. 16, the lines are shown in three graphs for explanation, where the lines of the 1st to 4th measurements are shown in FIG. 14, the lines of the 5th to 8th measurements are shown in FIG. 15, and the lines of the 9th and 10th measurements are shown in FIG. 16. Here, for example, the difference in temperature between the temperature obtained in the 7th measurement at which the temperature at 60 seconds after the starting of the measurement is the lowest and the 8th measurement at which the temperature at 140 seconds after the starting of the measurement is the highest, is 15° C. Further, the difference in temperature between the temperature obtained at 90 seconds after the starting of the measurement in the 7th measurement and the temperature obtained at 140 seconds after the starting of the measurement in the 8th measurement is 8° C. As explained here, the increasing of the temperature of the rotating table 12 at the predetermined radius direction (at the predetermined angle "θ") can be grasped by the graph.

Further, the temperature data display processing unit 57 may display a graph showing a relationship between the time and the temperature profile in the radius direction of the rotating table 12. For example, after the wafers W1 to W5 are heated, the user may appoint an arbitrary straight line extending in the radius direction on the color image of the rotating table 12 and the time from the starting of the measurement. The temperature data display processing unit 57 searches and extracts the measured temperature values from the temperature map data stored in the temperature map storing unit 53 which are corresponded with the angle "θ" appointed by the user and the time nearest to the appointed time. Then, the temperature data display processing unit 57 displays the graph of the extracted measured temperature values. For this graph as well, similar to the graphs of FIG. 14 to FIG. 16, when displaying the graph, the value of "θ" at the most inner position within an area appointed by the user may be used for example. Then, the measured temperature values of the addresses of r=1 to 128 at that angle "θ" are read out and the average values are calculated to be shown as the graph.

Figure 17:
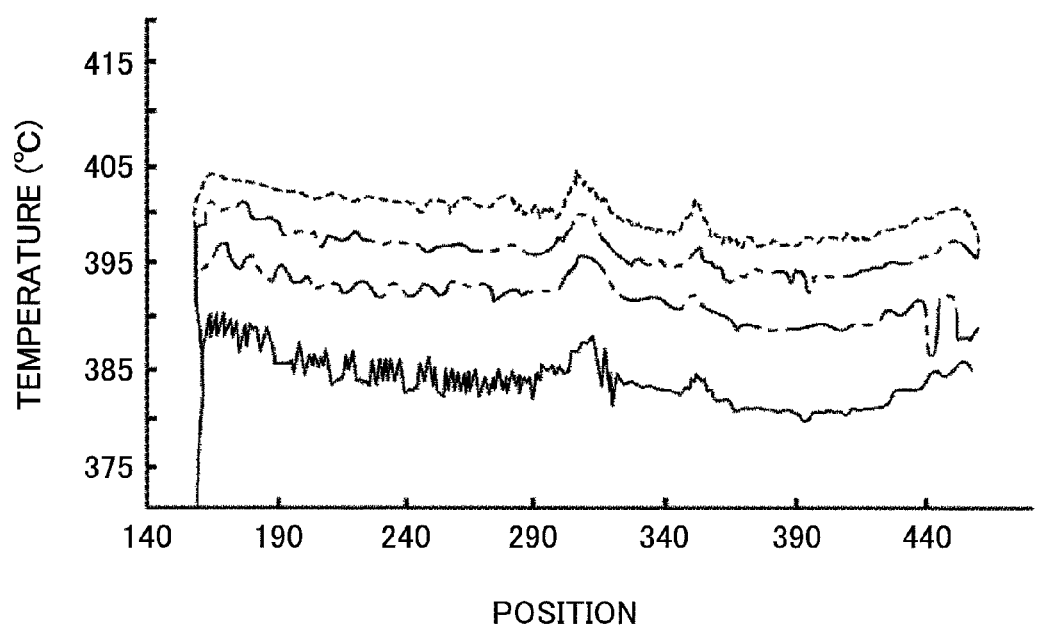
FIG. 17 is a graph showing a relationship between measured temperature values and positions in a radius direction of a rotating table.
Figure 18:
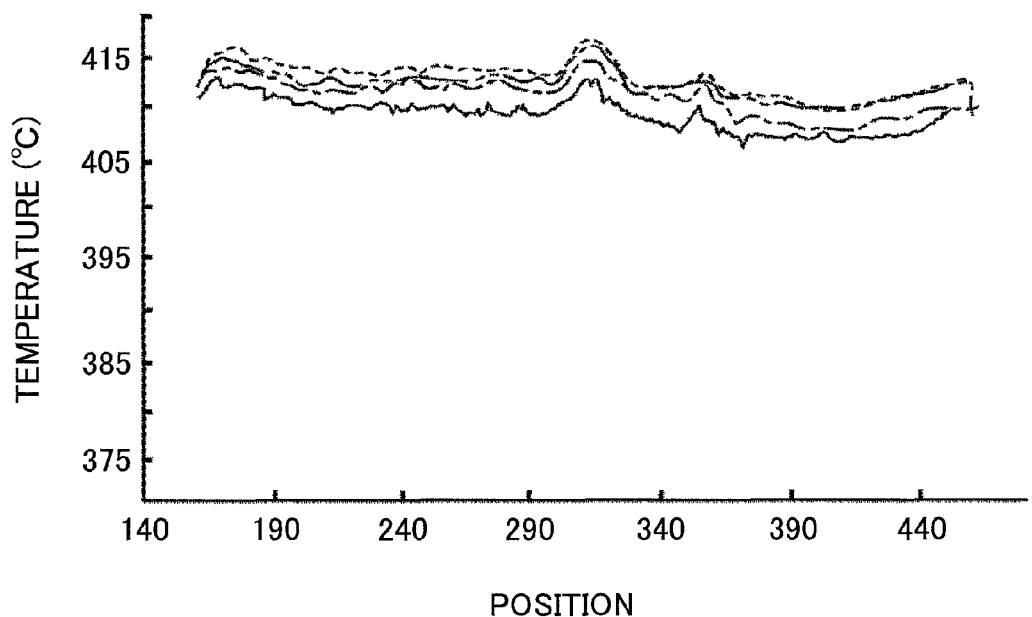
FIG. 18 is a graph showing a relationship between measured temperature values and positions in a radius direction of a rotating table.
Figure 19:
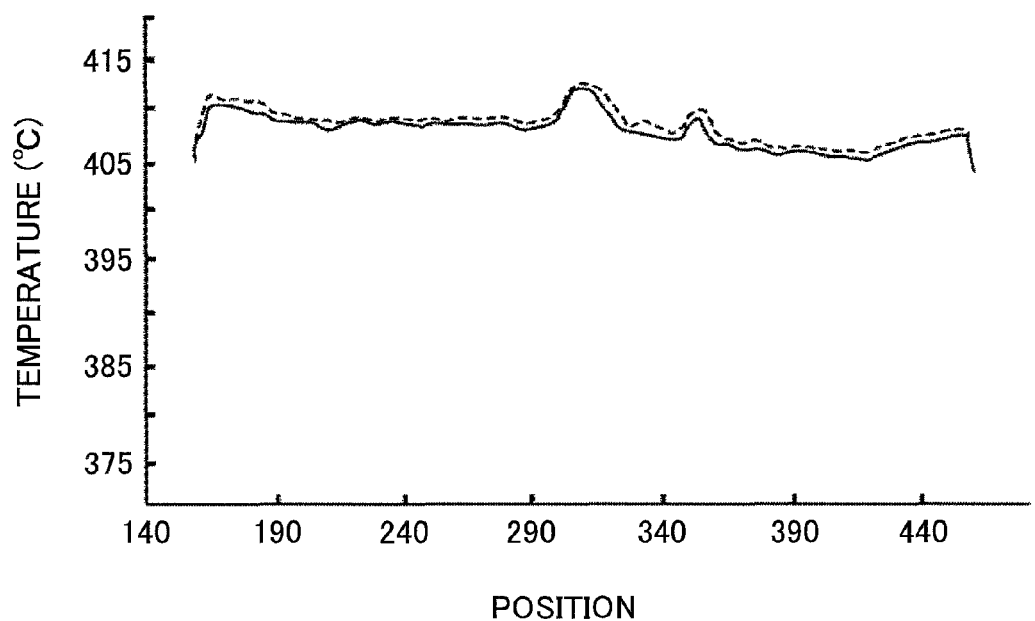
FIG. 19 is a graph showing a relationship between measured temperature values and positions in a radius direction of a rotating table.

FIG. 17 to FIG. 19 show an example of graphs showing the temperature profile at the area shown by the chain line 61 in FIG. 10 obtained at set different times, respectively. The abscissa axis of each of the graphs shows a distance (mm) of the rotating table 12 from the rotation center P which corresponds to the value of "r". The ordinate axis of each of the graphs shows temperature (° C.). The lines shown in FIG. 17 to FIG. 19 may be shown in a graph by color lines of different colors.

FIG. 17 shows the temperature profiles of the rotating table 12 in the radius direction obtained at 10 seconds, 20 seconds, 30 seconds and 40 seconds after the starting of the measurement. FIG. 18 shows the temperature profiles of the rotating table 12 in the radius direction obtained at 50 seconds, 60 seconds, 70 seconds and 80 seconds after the starting of the measurement. FIG. 19 shows the temperature profiles of the rotating table 12 in the radius direction obtained at 90 seconds and 105 seconds after the starting of the measurement. The temperature profiles of the rotating table 12 include the temperature profiles of the wafers W in the radius direction. With this structure, the user can easily grasp the increasing of the temperature at each of the positions in the radius direction.

According to the embodiment, the temperature of the rotating table 12 in the radius direction is obtained by repeatedly scanning the rotating table 12 in the radius direction while rotating the rotating table 12, the measured temperature values are stored as the temperature map data in correspondence with the addresses of the rotating table 12 and the time when the data is obtained, and the temperature profile of the rotating table 12 is displayed based on the temperature map data. With this structure, the user can easily grasp the temperature profile of the wafers W which are rotated.

Alternatively, for the graphs shown in FIG. 14 to FIG. 16, the temperature data display processing unit 57 may output the measured temperature values having the angle coordinates "θ" shifted as the radius coordinate "r" increases.

Similarly, for the graphs shown in FIG. 17 to FIG. 19, the temperature data display processing unit 57 may output the measured temperature values having the angle coordinates "θ" shifted as the radius coordinate "r" increases.

Further, in the above embodiment, although the temperature map data is generated by assuming that the rotating table 12 is rotated at 237.6 cycles/min, the temperature map data may be generated based on the actual rotation speed of 240 cycles/min. Further, the rotating speed of the rotating table 12 may be set as 237.6 cycles/min.

In the above embodiment, when displaying the data along the radius direction, it is assumed that the rotating table 12 is terminated in a period for a single scanning operation. As such, when the rotation speed of the rotation table 12 is sufficiently slower than the scanning speed of the radiation temperature measurement unit 3 so that the position of the rotating table 12 does not change largely in the single scanning operation, the address of the temperature measurement areas 40 may be determined regardless of the rotating table 12.

Further, in order to measure the temperature of the areas in as large a number as possible for accurately obtaining the temperature profile of the rotating table 12, the operation control unit 58 may control the rotation speed of the rotating table 12 based on the scanning speed of the radiation temperature measurement unit 3, such that the radiation temperature measurement unit 3 scans the surface of the rotating table 12 in the radius direction of the rotating table 12 greater than or equal to 10 times while the rotating table 12 is rotated for one cycle with respect to the radiation temperature measurement unit 3.

Further, when generating the temperature map, the number of scanning operations is not limited to the above described embodiment, and may be repeated greater than or equal to 100 times, for example. Further, the measured temperature values of each of the addresses are displayed as the color spots on the display unit 54 so that a gradation image of the rotating table 12 is shown, as explained above. The size of each of the color spots may be altered based on the number of scanning operations where the more the scanning operations are performed, as the number of the temperature measurement areas 40 increases, the smaller the size of the color spot becomes. When the image of the rotating table 12 is expressed by the large number of color spots with the smaller size, the temperature profile of the wafer W can be expressed in detail. For example, each of the color spots may express an area of the rotating table having a length between 1 mm to 5 mm in the rotation direction.

According to the temperature measurement apparatus of the embodiment, the temperature of the plural temperature measurement areas is measured by repeatedly scanning the rotating table in the radius direction while the rotating table is rotated, and the measured temperature values are stored in the storing unit in correspondence with the addresses of the rotating table corresponding to the temperature measurement areas, so that the temperature profile of the substrate mounted on the rotating table is displayed based on the data stored in the storing unit.

The present invention is not limited to the specifically disclosed embodiments, and variations and modifications may be made without departing from the scope of the present invention.

The present application is based on Japanese Priority Application No. 2011-118386 filed on May 26, 2011, the entire contents of which are hereby incorporated herein by reference.

What is claimed is:

1. A temperature measurement apparatus used for a heat treatment apparatus including a process container, in which a rotating table for mounting a substrate is provided, and a heater for heating the process container, comprising:
   a radiation temperature measurement unit configured to measure the temperature of plural temperature measurement areas on a surface of the rotating table in a radius direction of the rotating table by scanning the surface of the rotating table in the radius direction;
   a temperature map generating unit that
      specifies the address of the temperature measurement area for which the radiation temperature measurement unit measures the temperature based on the number of the temperature measurement areas measured by the radiation temperature measurement unit for each of the scanning operations in the radius direction of the rotating table, and the rotating speed of the rotating table, and
      stores the temperature in correspondence with the corresponding address in a storing unit; and
   a temperature data display processing unit that displays a temperature profile of the rotating table based on the temperature and the address stored in the storing unit by the temperature map generating unit,
   wherein the radiation temperature measurement unit includes
      a rotating body configured to rotate and provided with at least a reflection plane capable of reflecting infrared ray radiated from the surface of the rotating table, and
      a detection unit including a light receiver that receives the infrared ray reflected by the reflection plane of the rotating body, and
   wherein the radiation temperature measurement unit is configured to scan the surface of the rotating table in the radius direction such that a temperature measurement area on the surface of the rotating table shifts in the radius direction in accordance with the rotation of the rotating body to measure the temperature of plural temperature measurement areas.

2. The temperature measurement apparatus according to claim 1, further comprising:
   an instruction receiving unit that receives an instruction of a predetermined angle of the rotating table from a user as a display style of the temperature profile of the rotating table displayed by the temperature data display processing unit, and
   wherein the temperature data display processing unit displays the temperature profile of an area along the angle of the rotating table appointed by the user and received by the instruction receiving unit based on the temperature and the address stored in the storing unit.

3. The temperature measurement apparatus according to claim 1,
   wherein the radiation temperature measurement unit is configured to measure the temperature of the plural temperature measurement areas along a radius of the rotating table by scanning the surface of the rotating table in the radius direction at a predetermined position at the process container, and
   wherein the temperature map generating unit repeats the operation of specifying the address of the temperature measurement area for which the radiation temperature measurement unit measures the temperature until the rotating table is rotated for predetermined plural cycles with respect to the radiation temperature measurement unit, and stores the temperature in correspondence with the corresponding address in the storing unit.

4. The temperature measurement apparatus according to claim 3, further comprising:
   an instruction receiving unit that receives an instruction of a predetermined angle of the rotating table from a user as a display style of the temperature profile of the rotating table displayed by the temperature data display processing unit,
   wherein the temperature map generating unit stores the temperature in correspondence with the time when the temperature is measured in the storing unit, and
   wherein the temperature data display processing unit displays the temperature profile of an area which includes the angle of the rotating table appointed by the user and received by the instruction receiving unit as the address with respect to time based on the temperature, the address and the time stored in the storing unit.

5. The temperature measurement apparatus according to claim 1,
   wherein the temperature data display processing unit displays the temperature profile of the surface of the rotating table on which the substrate is mounted.

6. The temperature measurement apparatus according to claim 1, further comprising:
   an operation control unit that controls the rotation speed of the rotating table based on the scanning speed of the radiation temperature measurement unit, such that the radiation temperature measurement unit scans the surface of the rotating table in the radius direction of the rotating table greater than or equal to 10 times while the rotating table is rotated for one cycle with respect to the radiation temperature measurement unit.

7. The temperature measurement apparatus according to claim 1,
   wherein the radiation temperature measurement unit measures the surface of the rotating table by receiving the infrared ray radiated from the surface of the rotating table and reflected by the reflection plane of the rotating body, wherein the process container is provided with a slit at a predetermined position along an inner side to an outer side of the rotating table at an upper portion of the process container and a transparent plate which is configured to cover the slit as well as capable of transmitting the infrared ray, and wherein the radiation temperature measurement unit measures the temperature of the plural temperature measurement areas along the radius direction of the rotating table by scanning the surface of the rotating table in the radius direction of the rotating table via the transparent plate.

8. The temperature measurement apparatus according to claim 1, wherein the radiation temperature measurement unit is provided to scan the surface of the rotating table from an inner side to an outer side in the radius direction of the rotating table.

9. A heat treatment apparatus, comprising:

the process container in which the rotating table for mounting the substrate is provided;

the heater that heats the process container; and the temperature measurement apparatus according to claim 1.

10. A method of measuring a temperature profile of a substrate mounted on a rotating table within a process container included in a heat treatment apparatus which further includes a heater for heating the process container, comprising:

repeating a scanning operation, in which a radiation temperature measurement unit, which is configured to measure temperature of plural temperature measurement areas on a surface of the rotating table in a radius direction of the rotating table by scanning the surface of the rotating table in the radius direction, scans the surface of the rotating table, on which the substrate is mounted, in the radius direction to obtain the temperature of the plural temperature measurement areas in the radius direction while the rotating table is rotated in a circumferential direction of the rotating table with respect to the radiation temperature measurement unit;

specifying the address of the temperature measurement area for which the temperature is obtained based on the number of the temperature measurement areas obtained by the radiation temperature measurement unit for each of the scanning operations in the radius direction of the rotating table, and the rotating speed of the rotating table;

storing the temperature in correspondence with the corresponding address in a storing unit; and displaying the temperature profile of the surface of the substrate and the rotating table based on the temperature and the address stored in the storing unit, wherein the radiation temperature measurement unit includes a rotating body configured to rotate and provided with at least a reflection plane capable of reflecting infrared ray radiated from the surface of the rotating table, and a detection unit including a light receiver that receives the infrared ray reflected by the reflection plane of the rotating body, and wherein in the repeating the scanning operation, the radiation temperature measurement unit is configured to scan the surface of the rotating table in the radius direction such that a temperature measurement area on the surface of the rotating table shifts in the radius direction in accordance with the rotation of the rotating body to measure the temperature of plural temperature measurement areas.

11. The method of measuring a temperature profile according to claim 10, further comprising:

receiving an instruction of a predetermined angle of the rotating table from a user, and wherein in the displaying the temperature profile, the temperature profile of an area along the angle of the rotating table appointed by the user is displayed based on the temperature and the address stored in the storing unit.

12. The method of measuring a temperature profile according to claim 10, wherein the radiation temperature measurement unit is configured to measure the temperature of the plural temperature measurement areas along a radius of the rotating table by scanning the surface of the rotating table in the radius direction at a predetermined position at the process container, in the repeating the scanning operation, the radiation temperature measurement unit scans the surface of the rotating table in the radius direction until the rotating table is rotated for predetermined plural cycles with respect to the radiation temperature measurement unit, and in the specifying the address of the temperature measurement area, the operation of specifying the address of the temperature measurement area is repeated until the rotating table is rotated for predetermined plural cycles with respect to the radiation temperature measurement unit.

13. The method of measuring a temperature profile according to claim 12, further including:

receiving an instruction of a predetermined angle of the rotating table from a user, wherein in storing the temperature, the temperature is stored in the storing unit in correspondence with the time when the temperature is measured, and in displaying the temperature profile, the temperature profile of an area which includes the angle of the rotating table appointed by the user as the address with respect to time based on the temperature, the address and the time stored in the storing unit.

14. A non-transitory computer-readable recording medium having recorded thereon a program that causes a computer to execute the method of measuring a temperature profile according to claim 10.

* * * * *